(12) United States Patent
Ghan et al.

(10) Patent No.: US 8,069,423 B2
(45) Date of Patent: Nov. 29, 2011

(54) SYSTEM AND METHOD FOR MODEL BASED MULTI-PATTERNING OPTIMIZATION

(75) Inventors: Justin Ghan, Berkeley, CA (US);
Abdurrahman Sezginer, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 492 days.

(21) Appl. No.: 12/189,692

(22) Filed: Aug. 11, 2008

(65) Prior Publication Data
US 2010/0037200 A1 Feb. 11, 2010

(51) Int. Cl.
*G06F 17/50* (2006.01)
(52) U.S. Cl. ........................................................ 716/55
(58) Field of Classification Search .................... 716/55, 716/44
See application file for complete search history.

(56) References Cited

U.S. PATENT DOCUMENTS

| | | | |
|---|---|---|---|
| 5,552,996 | A | 9/1996 | Hoffman et al. |
| 5,739,898 | A * | 4/1998 | Ozawa et al. ................ 355/53 |
| 5,784,289 | A | 7/1998 | Wang |
| 6,189,130 | B1 | 2/2001 | Gofman et al. |
| 6,518,180 | B1 * | 2/2003 | Fukuda .................. 430/311 |
| 6,553,562 | B2 * | 4/2003 | Capodieci et al. ........... 716/53 |
| 6,574,782 | B1 | 6/2003 | Dewey, III et al. |
| 6,578,190 | B2 | 6/2003 | Ferguson et al. |
| 6,625,802 | B2 | 9/2003 | Singh et al. |
| 6,670,080 | B2 * | 12/2003 | Sugita et al. ..................... 430/5 |
| 6,721,938 | B2 | 4/2004 | Pierrat et al. |
| 6,893,800 | B2 | 5/2005 | Jessen et al. |
| 7,082,588 | B2 | 7/2006 | Scheffer |
| 7,254,798 | B2 | 8/2007 | Scheffer |
| 7,861,196 | B2 | 12/2010 | Huckabay et al. |
| 2003/0229881 | A1 | 12/2003 | White et al. |
| 2004/0058255 | A1 | 3/2004 | Jessen et al. |
| 2004/0216065 | A1 | 10/2004 | Cobb et al. |
| 2005/0044514 | A1 | 2/2005 | Wu et al. |
| 2005/0076316 | A1 | 4/2005 | Pierrat et al. |
| 2007/0031740 | A1 * | 2/2007 | Chen et al. ..................... 430/5 |

(Continued)

FOREIGN PATENT DOCUMENTS
WO WO 2005/109256 11/2005
(Continued)

OTHER PUBLICATIONS
U.S. Appl. No. 12/251,455, filed Oct. 14, 2008, Wang, Xiaojun, et al.
(Continued)

*Primary Examiner* — Jack Chiang
*Assistant Examiner* — Brandon Bowers
(74) *Attorney, Agent, or Firm* — Adeli & Tollen LLP

(57) ABSTRACT

Some embodiments provide a method for optimally decomposing patterns within particular spatial regions of interest on a particular layer of a design layout for a multi-exposure photolithographic process. Specifically, some embodiments model the spatial region using a mathematical equation in terms of two or more intensities. Some embodiments then optimize the model across a set of feasible intensities. The optimization yields a set of intensities such that the union of the patterns created/printed from each exposure intensity most closely approximates the patterns within the particular regions. Based on the set of intensities, some embodiments then determine a decomposition solution for the patterns that satisfies design constraints of a multi-exposure photolithographic printing process. In this manner, some embodiments achieve an optimal photolithographic printing of the particular regions of interest without performing geometric rule based decomposition.

25 Claims, 23 Drawing Sheets

U.S. PATENT DOCUMENTS

| | | |
|---|---|---|
| 2008/0069432 A1 | 3/2008 | Hsu et al. |
| 2008/0144969 A1 | 6/2008 | Park |
| 2009/0148783 A1 | 6/2009 | Socha |
| 2009/0199137 A1 | 8/2009 | Huckabay et al. |
| 2010/0017779 A1 | 1/2010 | Kim |

FOREIGN PATENT DOCUMENTS

| | | |
|---|---|---|
| WO | WO 2005/109257 | 11/2005 |

OTHER PUBLICATIONS

Portions of prosecution history of U.S. Appl. No. 12/023,512, Mailing Date Jan. 6, 2010, Huckabay, Judy, et al.

Response to Non-Final Office Action of U.S. Appl. No. 12/023,512, Mailing Date May 6, 2010, Huckabay, Judy, et al.

U.S. Appl. No. 12/955,895, filed Nov. 29, 2010, Huckabay, Judy, et al.

Portions of prosecution history of U.S. Appl. No. 10/836,581, Mailing Date Mar. 1, 2006, Scheffer, Louis K.

Portions of prosecution history of U.S. Appl. No. 10/836,582, Mailing Date Mar. 28, 2007, Scheffer, Louis K.

Updated portions of prosecution history of U.S. Appl. No. 12/023,512, Mailing Date Nov. 22, 2010, Huckabay, Judy, et al.

International Search Report and Written Opinion for PCT/US2005/014983, mailing date Mar. 15, 2006, Cadence Design Systems, Inc.

International Preliminary Report on Patentability for PCT/US2005/014983, completion date Mar. 7, 2006, Cadence Design Systems, Inc.

International Search Report and Written Opinion for PCT/US2005/015024, mailing date Oct. 12, 2005, Cadence Design Systems, Inc.

International Preliminary Report on Patentability for PCT/US2005/015024, issuance date Nov. 1, 2006, Cadence Design Systems, Inc.

* cited by examiner

SYSTEM AND METHOD FOR MODEL BASED MULTI-PATTERNING OPTIMIZATION

FIELD OF THE INVENTION

The invention relates to the design and manufacture of integrated circuits. Specifically, the invention relates to systems and methods for improving the photolithographic printability of an integrated circuit design layout.

BACKGROUND OF THE INVENTION

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components.

Design engineers design ICs by transforming logical or circuit descriptions of the ICs' components into geometric descriptions, called design layouts. IC design layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. In this fashion, design layouts often describe the behavioral, architectural, functional, and structural attributes of the IC.

To create the design layouts, design engineers typically use electronic design automation ("EDA") applications. These applications provide sets of computer-based tools for creating, editing, analyzing, and verifying design layouts.

Fabrication foundries ("fabs") manufacture ICs based on the design layouts using a photolithographic process. Photolithography is an optical printing and fabrication process by which patterns on a photolithographic mask (i.e., photomask) are imaged and defined onto a photosensitive layer coating a substrate. To fabricate an IC, photomasks are created using the IC design layout as a template. The photomasks contain the various geometries (i.e., features) of the IC design layout. The various geometries contained on the photomasks correspond to the various base physical IC elements that comprise functional circuit components such as transistors, interconnect wiring, via pads, as well as other elements that are not functional circuit elements but that are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As circuit complexity continues to increase and transistor designs become more advanced and ever smaller in size (i.e., die shrink), advances in photolithographic processes are being pursued to enable the large scale, low cost manufacturing of such circuits. However, constraining factors in traditional photolithographic processes limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain pitch, distance, and other such physical manufacturing constraints.

A pitch specifies a sum of the width of a feature and the space on one side of the feature separating that feature from a neighboring feature. Depending on the photolithographic process at issue, factors such as optics and wavelengths of light or radiation restrict how small the pitch may be made before features can no longer be reliably printed to a wafer or mask. As such, the smallest size of any features that can be created on a wafer is severely limited by the pitch.

FIG. 1 illustrates a typical pitch constraint of a photolithographic process. In FIG. 1, a pitch 110 acts to constrain the spacing between printable features 120 and 130 of a design layout. While other photolithographic process factors such as the threshold 140 can be used to narrow the width 150 of the features 120 and 130, such adjustments do not result in increased feature density without adjustments to the pitch 110. As a result, increasing feature densities beyond a certain threshold is infeasible via a pitch constrained single exposure process.

Certain reticle enhancement techniques (RET) allow for photolithographic processes to extend beyond some of the various photolithographic manufacturing constraints such as the width constraint. Some common techniques include: using optical proximity correction (OPC) to distort photomask shapes to compensate for image errors resulting from diffraction or process effects that cause pattern inaccuracies, using off-axis illumination (OAI) for optimizing the angle of illumination for a particular pitch, using alternating phase shift masks (PSM) for improving lithographic resolution by introducing a particular phase shift between adjacent patterns or features on a photomask, and using scatter bars to place narrow lines or spaces adjacent to a feature in order to make a relatively isolated line behave more like a dense line.

However, these and other techniques are limited both by cost and effectiveness. To overcome these and other constraints, some fabrication processes have implemented a multiple exposure photolithographic process as illustrated in FIG. 2.

In FIG. 2, a design layout 205 specifies three features 210-230 that are pitch constrained and therefore cannot be photolithographically printed with a conventional single exposure process. Analysis of the characteristics (e.g., the band limitation) of the available photolithographic process and of the design layout 205 results in the decomposition of the design layout 205 into a first exposure 240 for printing features 210 and 230 and a second exposure 250 for printing feature 220. As such, the features 210 and 230 are assigned to a first photomask for printing during the first exposure 240 and feature 220 is assigned to a second photomask for printing during the second exposure 250.

FIG. 3 illustrates a decomposition of a pattern 310 defined in a layer of design layout for fabricating an IC into two sets of polygons 320 and 330. Each such decomposed set of polygons 320 and 330 is printed during an exposure of a multiple exposure photolithographic printing process. For instance, polygon set 320 is printed during a first exposure in order to produce contours 340 and polygon set 330 is printed during a second exposure in order to produce contours 350. The resulting union of the contours 340 and 350 generates pattern 360 that is sufficient to approximately reproduce the original pattern 310. Accordingly, a valid decomposition solution is such that the union of the contours created/printed from each exposure closely approximates specifications within the original design layout and satisfies multi-exposure photolithographic printing constraints (e.g., the band limit and the target layout specified within the design layout) with no resulting "opens", "shorts", or other printing errors materializing on the physical wafer.

Existing decomposition tools for decomposing layouts into one or more exposures are often rule based and proceed on a pattern by pattern (i.e., geometry by geometry) basis. Such tools are therefore applicable only to patterns for which a pre-programmed or known decomposition solution exists within a library. These tools are effective for decomposing simple designs with regular repeating patterns such as gradings including lines and spaces. However, design layouts with more sophisticated geometries (e.g., logic designs and microprocessor designs containing complex patterns and shapes with bends and jogs) cannot be processed using these existing decomposition tools as solutions do not exist for the unique patterns appearing within such design layouts. Instead, layout designers would be notified of the patterns for which a known solution does not exist. The layout designers would then be prompted to manually produce a decomposition solution for these patterns. To remedy this issue, solution providers must continually update the pattern libraries and algorithms used by these tools to accommodate the growing complexity of the design layouts.

Moreover, existing decomposition tools are inefficient in the manner by which they perform decomposition analysis. Repeated polygonal patterns within a single design layout are each independently analyzed and a solution is provided for each instance as if each instance is the first such instance. Therefore, the more dense a design layout, the more time and processing resources needed to process and decompose the design layout. Also, traditional prior art decomposition tools often operate in a local area by local area basis such that solutions provided to remedy printability issues appearing within a particular local area may have a detrimental effect to other unprocessed or processed local areas of the layout.

Therefore, there is a need to efficiently and effectively decompose an entire layout or section of a layout while avoiding the pitfalls associated with geometric rule based decomposition techniques. Moreover, there is need to generalize such techniques and tools such that the applicability of these techniques and tools is no longer restricted to a known or pre-programmed set of solutions.

SUMMARY OF THE INVENTION

Some embodiments provide a method for decomposing a particular pattern on a layer of a design layout into multiple patterns that can be produced in multiple photolithographic operations. Based on a particular model, the method searches through the space of lithographically feasible images to identify a set of at least two images for decomposing the particular pattern. In some embodiments, the particular model is an image-intensity model that bounds the search to only intensity images that are feasible solutions for decomposing the particular pattern. For instance, in some embodiments, the model includes two or more Fourier decomposition equations for two or more intensity images.

Once the method identifies the set of images for decomposing the particular pattern, the method then determines whether the union of the identified set of images is sufficiently close to the particular pattern. When the union is not sufficiently similar to the particular pattern, the method repeats the above process by searching again through the solution space of feasible photolithographic images to identify another set of feasible images that need to be compared with the particular pattern. When the method identifies a set of images (e.g., two intensity images) whose union is sufficiently similar to the particular pattern, the method uses the identified set of images to produce a set of mask layouts (e.g., two mask layouts). The mask-layout set can then be used to produce the particular pattern on a substrate or on one of the layers defined above or below a substrate.

BRIEF DESCRIPTION OF THE SEVERAL VIEWS OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Overview

Figure 1:
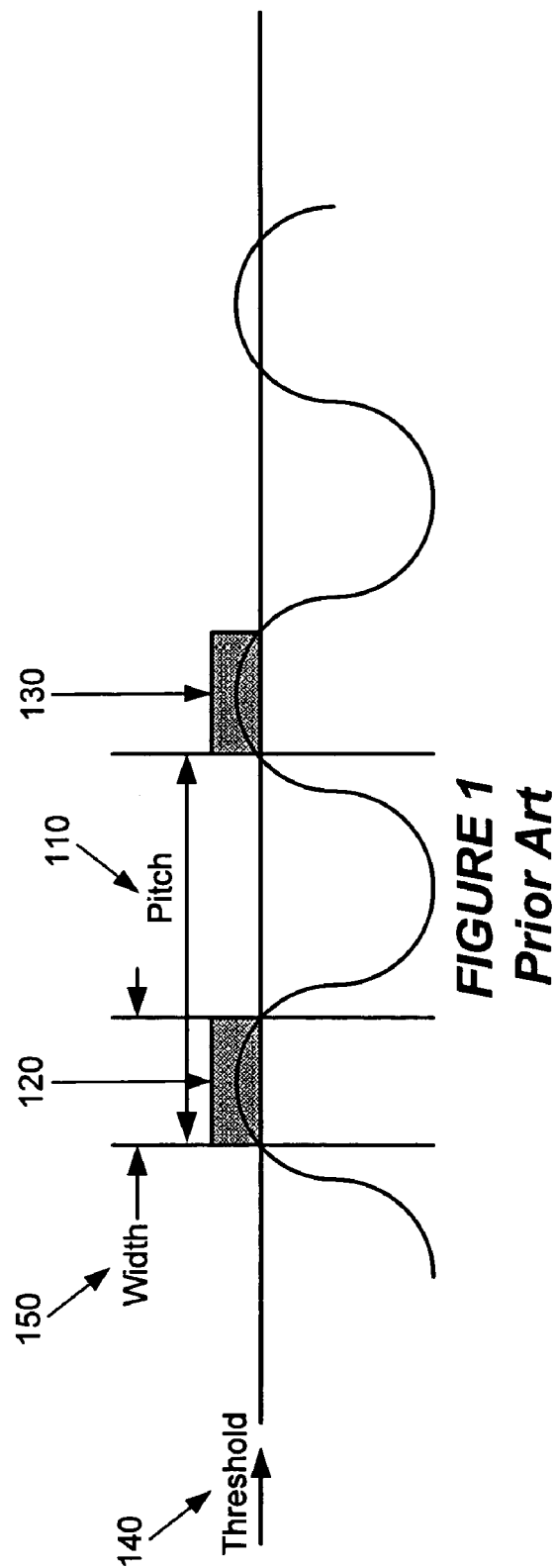
FIG. 1 illustrates a typical orthogonal pitch constraint imposed by a photolithographic process.
Figure 2:
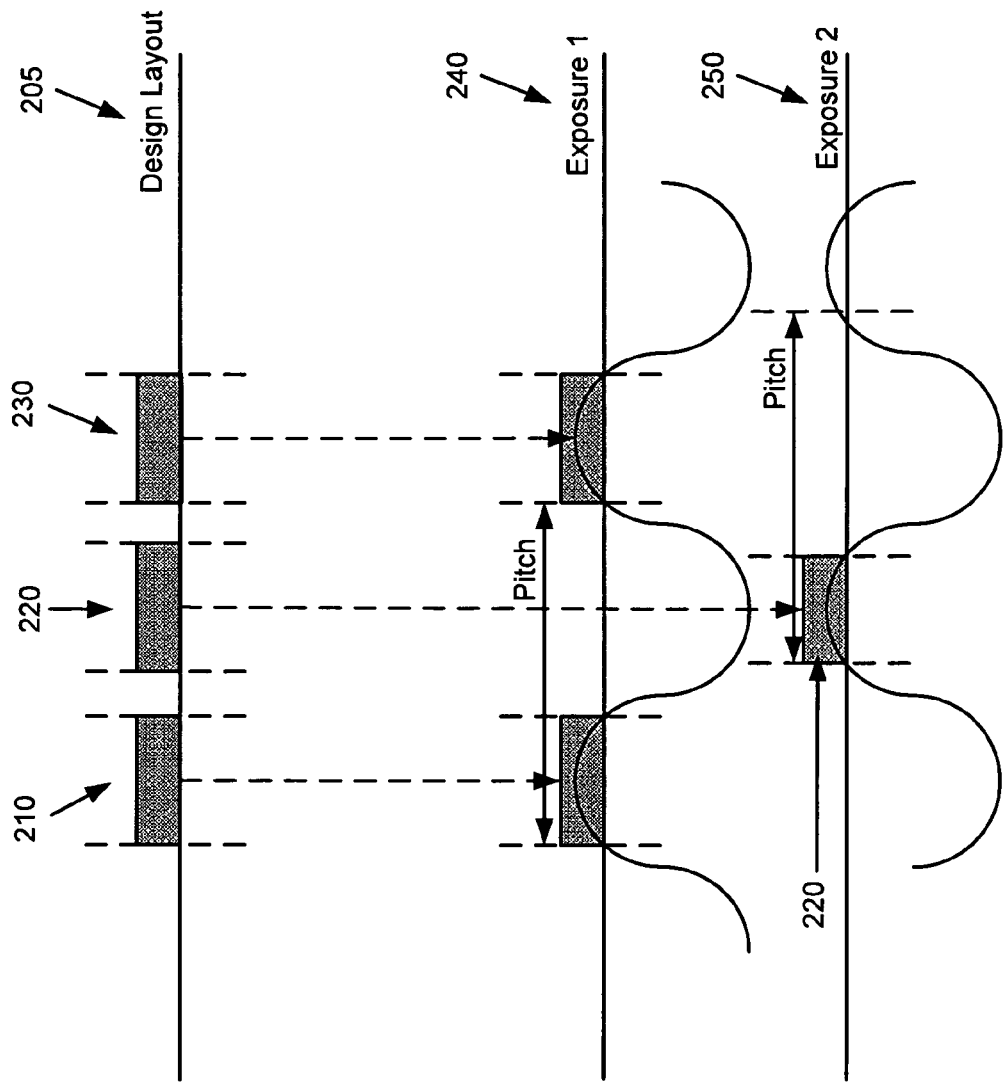
FIG. 2 illustrates a fabrication processes implementing a multiple exposure photolithographic process.
Figure 3:
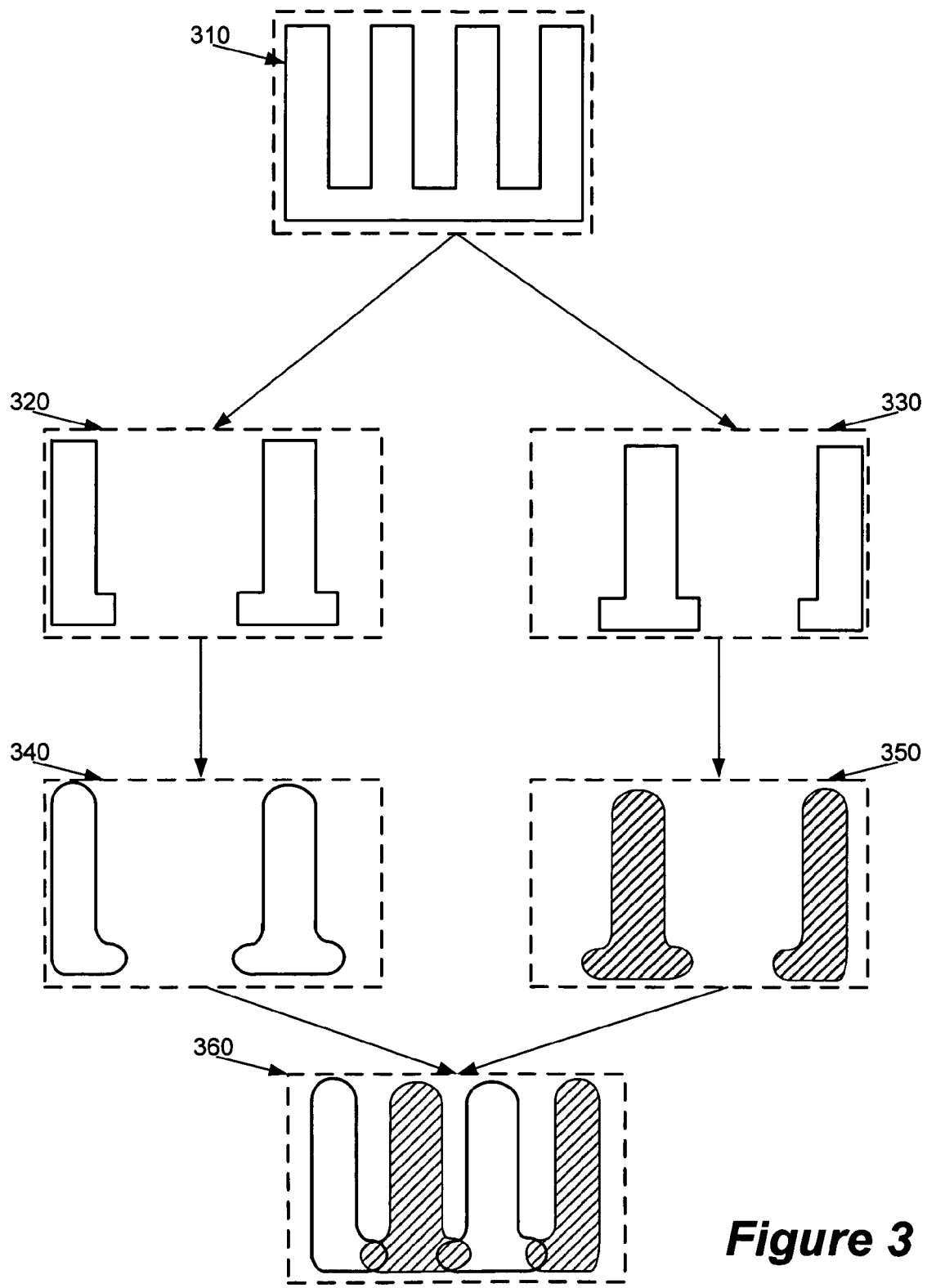
FIG. 3 illustrates a decomposition of a pattern into two sets of polygons.
Figure 4:
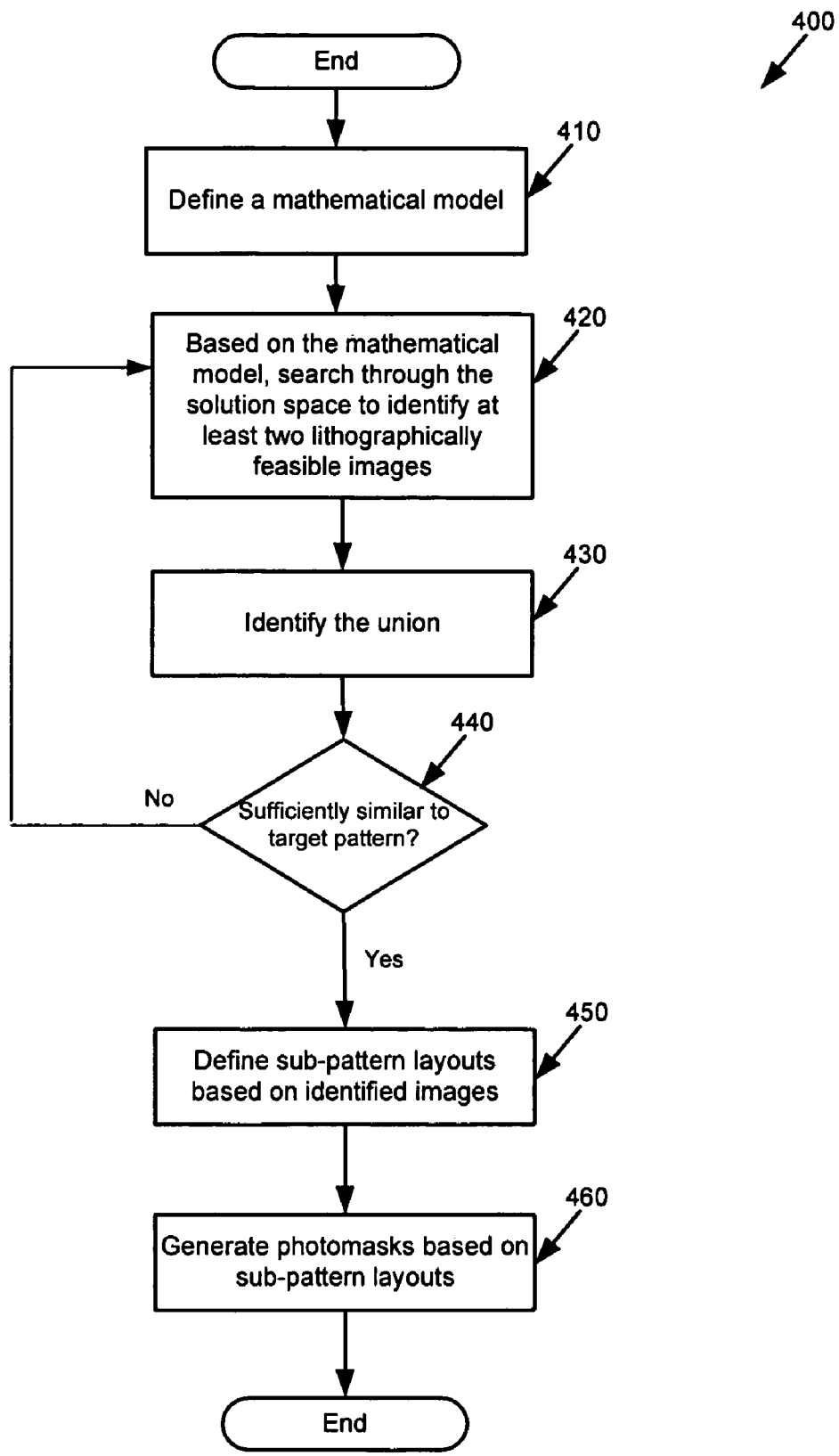
FIG. 4 presents a process for decomposing a particular pattern on a layer of a design layout into multiple patterns that can be produced in multiple photolithographic operations in accordance with some embodiments.

Some embodiments provide a process for decomposing a particular pattern on a layer of a design layout into multiple patterns that can be produced in multiple photolithographic operations for fabricating an integrated circuit (IC). FIG. 4 illustrates one example of such a process for some embodiments of the invention. As shown in FIG. 4, the process 400 initially defines (at 410) a model that expresses the range of feasible solutions for decomposing the particular pattern. In some embodiments, the model expresses the range of feasible solutions mathematically. In some embodiments, the particular model is an image-intensity model that bounds the search to only intensity images that are feasible solutions for decomposing the pattern. For instance, in some embodiments, the model includes two or more Fourier decomposition equations for two or more intensity images.

Next, at 420, the process searches through the solution space of lithographically feasible images to identify a set of at least two images. The process then identifies the union (at 430) of the identified set of images. The process next determines (at 440) whether the identified union would produce a pattern that would be sufficiently close to the particular pattern that is being decomposed.

When the union is not sufficiently similar to the particular target pattern, the process 400 returns to 420 to search again through the solution space of feasible photolithographic images to identify another set of feasible images. For this new solution, the process again performs operations 430 and 440 to determine whether the union of the images that are part of the new solution is sufficiently close to the particular target pattern. In some embodiments, the determination is based on whether the images, when used to construct photomasks for a multi-exposure photolithographic process, will yield lithographically printed features that satisfy printing constraints and sufficiently represent the original target pattern.

Once the process determines (at 440) that the union of a set of identified images (e.g., the union of two identified intensity images) is sufficiently similar to the particular pattern, the process defines (at 450) a sub-pattern layout for each identified image. The process then generates (at 460) a set of photomask layouts (e.g., two photomask layouts) from the defined sub-pattern layouts. The photomask layouts can then be used to produce the particular pattern on a substrate or on one of the layers defined above or below a substrate.

Figure 5:
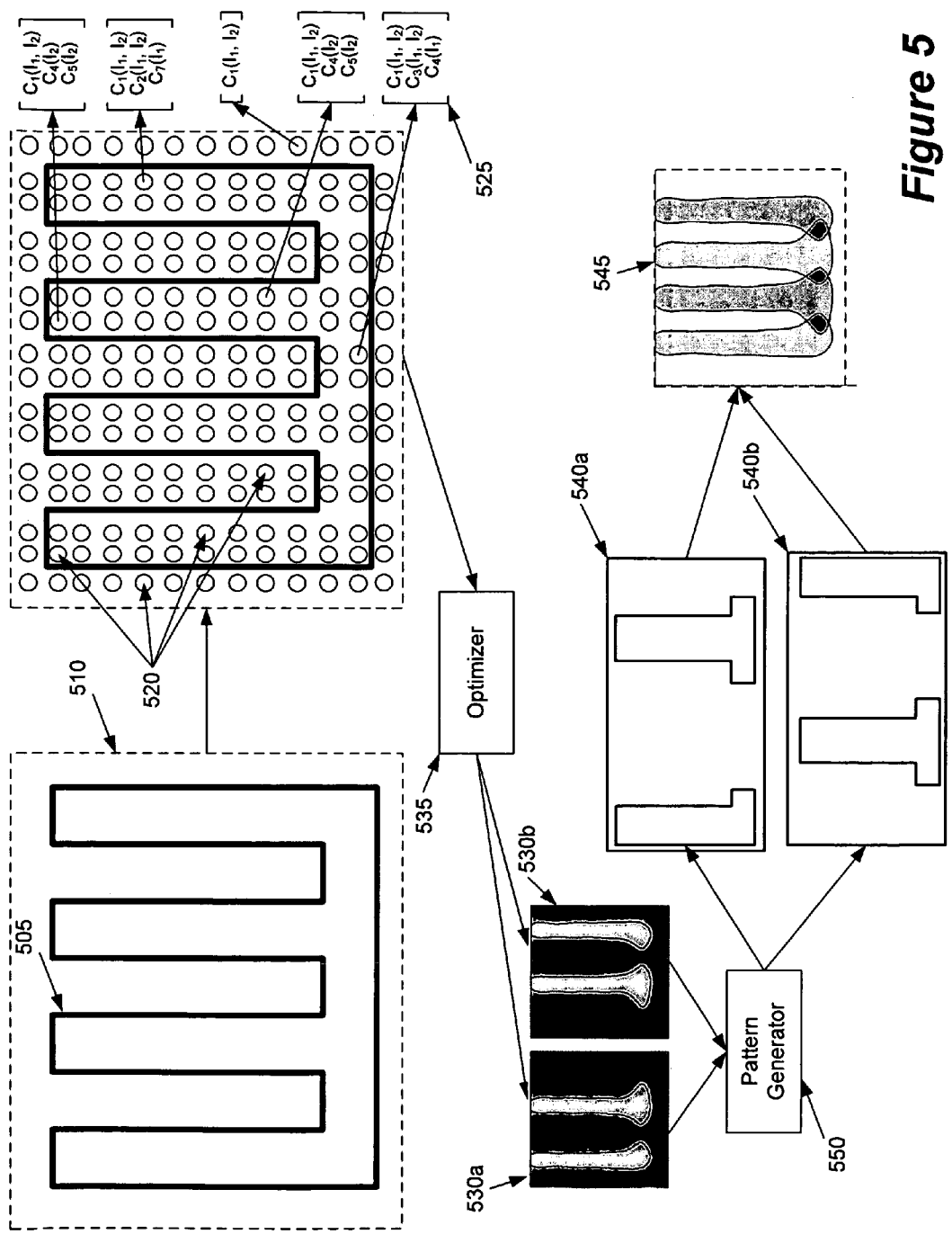
FIG. 5 presents a more-detailed illustration of the process of FIG. 4.

FIG. 5 illustrates a more-detailed example of the operation of some embodiments of the invention. In this example, several operations are performed to decompose a pattern 505 in a region 510 of a particular layer of an IC design layout for use in a multi-patterning photolithographic process. In this example, the pattern 505 is decomposed into two patterns. However, one of ordinary skill will realize that the invention can be used to decompose the pattern into three or more patterns.

As shown in FIG. 5, some embodiments initially impose a grid on the region to define a set of nodes 520 (shown as circles) in the region. These embodiments then define a cost function F for the region in terms of two intensity values, $I_1$ and $I_2$, as described in further detail below. To define this cost function F, these embodiments define one or more cost expressions 525 (e.g., cost expressions C1, C2, etc. in FIG. 5) for each node. Each cost expression for a node is based on a cost constraint that is defined in terms of one or both of the intensity values, $I_1$ and $I_2$, for that node. When a node has more than one cost expression, some embodiments produce a single weighted cost expression for the node by using one or more weighting factors to combine the individual cost expressions of the node.

After defining the cost expression for each node and thereby the cost function F for the region 510, some embodiments use an optimizer 535 that implements an optimization algorithm to search the solution space of intensity values to identify an optimal solution for the cost function. For instance, some embodiments search the solution space to find a solution that minimizes the cost function $F^T F$, where F is defined as a function that has a small value when the union of the two intensity images closely matches the original pattern.

To search this solution space, some embodiments define a mathematical image-intensity model that bounds the search to only intensity values that are feasible solutions for decomposing the pattern. For instance, in some embodiments, the model for the example illustrated in FIG. 5 includes two Fourier decomposition equations for two intensity images.

Accordingly, the output result of the optimization algorithm 535 in some embodiments is a set of Fourier coefficients that can be used to define two intensity images 530a and 530b (also called intensity graphs below) for the region. Each intensity image is a grayscale image. In some embodiments, a white value in an intensity image represents a location in the region that should receive light during the exposure corresponding to the particular intensity, whereas a black value in the intensity image represents a location in the region that should not receive light during that exposure. A gray value is a value between the white and black values; the location of a gray value may or may not receive light depending on its level of "grayness".

After obtaining the grayscale intensity images, a pattern generator 550 generates two sets of polygons 540a and 540b from the intensity images 530a and 530b. Each polygon set defines a sub-pattern that needs to be produced during one of two lithographic exposures. In other words, the two sets of polygons are the two patterns that decompose the original pattern 505.

To generate the two sets of polygons 540a and 540b (i.e., sub-patterns), the pattern generator 550 of some embodiments imposes a grid on the intensity images 530a and 530b that are the output result, or can be obtained from the output result, of the optimization process 535. Some embodiments use a coarser grid than the grid 520 that was previously specified to specify the cost function F, although other embodiments use the same grid or a finer grid on the intensity images. For each node on the imposed grid, some embodiments use a threshold value to convert any node's gray value in an intensity image associated to a black or white value. These embodiments then generate two polygon layouts from the two resulting intensity images where the white values signify patterns or features that should be lithographically printed (e.g., by using the resulting white values in each intensity image to generate one or more polygons in the polygon layout).

In some embodiments, the pattern generator 550 generates the sub-patterns by (1) forming the intersection of the polygons in the original pattern 505 with a set of points of the first intensity image that exceed the threshold value (i.e., $I_1(x, y) > t$), and (2) forming the intersection of the polygons in the original pattern 505 with a set of points of the second intensity image that exceed the threshold value (i.e., $I_2(x,y) > t$). These intersections are approximated by unions of polygons. These polygons (1) make up a first pattern 540*a* that is used to make a first photomask, and (2) make up the second pattern 540*b* that is used to make a second photomask.

In the examples above, polygons represent bright features in a dark background. This is the case when using a positive photoresist for Damascene metal layers and contact hole layers. However, it should be apparent to one of ordinary skill in the art that some embodiments might employ a different optical polarity such that the polygons represent dark features in a bright background. In such a case, the pattern 540*a* would be derived from the intersection of the original pattern 505 with the set of points at which $I_1(x,y) < t$, and pattern 540*b* would be derived from the intersection of the original pattern 505 with the set of points at which $I_2(x,y) < t$.

Each polygon layout (i.e., each identified sub-pattern) can then be used to generate a mask layout for a separate lithograph exposure operation during the multi-patterning photolithography process that is used to fabricate the IC layout. Any known techniques can be used to generate a particular photomask from a particular exposure polygon layout. Examples of some techniques include optical proximity correction and sub-resolution assist features.

The generated photomasks can then be used to generate the desired exposure sub-patterns to be produced on a desired semiconductor substrate layer (i.e., on the substrates itself or on one of the layers above or below the substrate). This exposure would then create the sub-patterns on the desired semiconductor layer. The union of the created sub-patterns would then serve as a close replication 545 of the pattern 505, as shown in FIG. 5.

Several more detailed embodiments of the invention are described in the sections below. Section II describes deriving the cost function based on a set of constraints assigned to nodes defined over a region of interest. Next, Section III describes solving the cost function to identify an optimal set of intensity images based on the set of constraints. Section IV provides a software architecture used by some embodiments. Lastly, Section V provides a description of a system architecture with which some embodiments of the invention are implemented.

II. Cost Function

Figure 6:
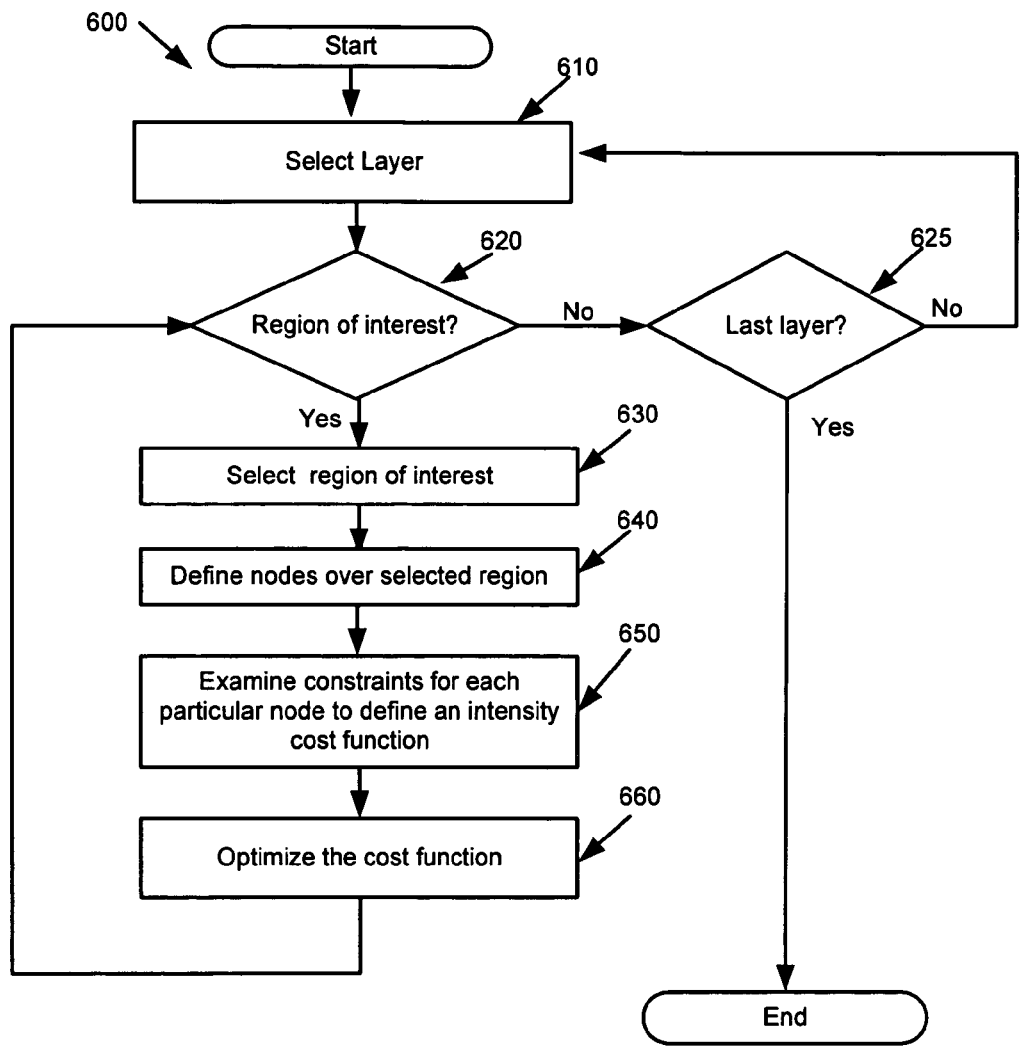
FIG. 6 presents a process for deriving the cost function in accordance with some embodiments.

FIG. 6 presents a process 600 for deriving the cost function in accordance with some embodiments. In some embodiments, the process 600 is performed in conjunction with multi-patterning decomposition. The process begins by selecting (at 610) a layer within a design layout used for fabricating an IC. The process determines (at 620) whether a region of interest on the layer requires decomposition for printing in a multi-exposure photolithographic process. When no such region of interest exists on the selected layer, the process determines (at 625) whether additional layers remain. When no layers remain, the process ends. Otherwise, the process selects the next region (at 610) and reexamines the layer for any regions of interest.

When a region of interest is identified within a selected layer, the process selects (at 630) the region of interest and defines (at 640) nodes over the selected region. The process examines (at 650) one or more constraints for each particular node in order to define the cost function. The process then optimizes (at 660) the cost function before returning to examine any additional regions of interest within the selected layer. Several more detailed examples for deriving the cost function are provided below.

A. Node Designation

Some embodiments avoid the geometric pattern by pattern analysis performed by various other double patterning optimization solutions by imposing a grid over a region of interest in order to divide the region into a discretized set of nodes. A sufficient sampling of the region (e.g., a rate equal to or exceeding the Nyquist sampling rate) is taken in order to represent all features within the region of interest with sufficient granularity. In this manner, the continuous space of the region of interest is mapped to a finite set of parameterizable elements. As such, modifications to the sampling rate affects the accuracy of the results relative to the processing resources and time needed to produce the results.

Figure 7:
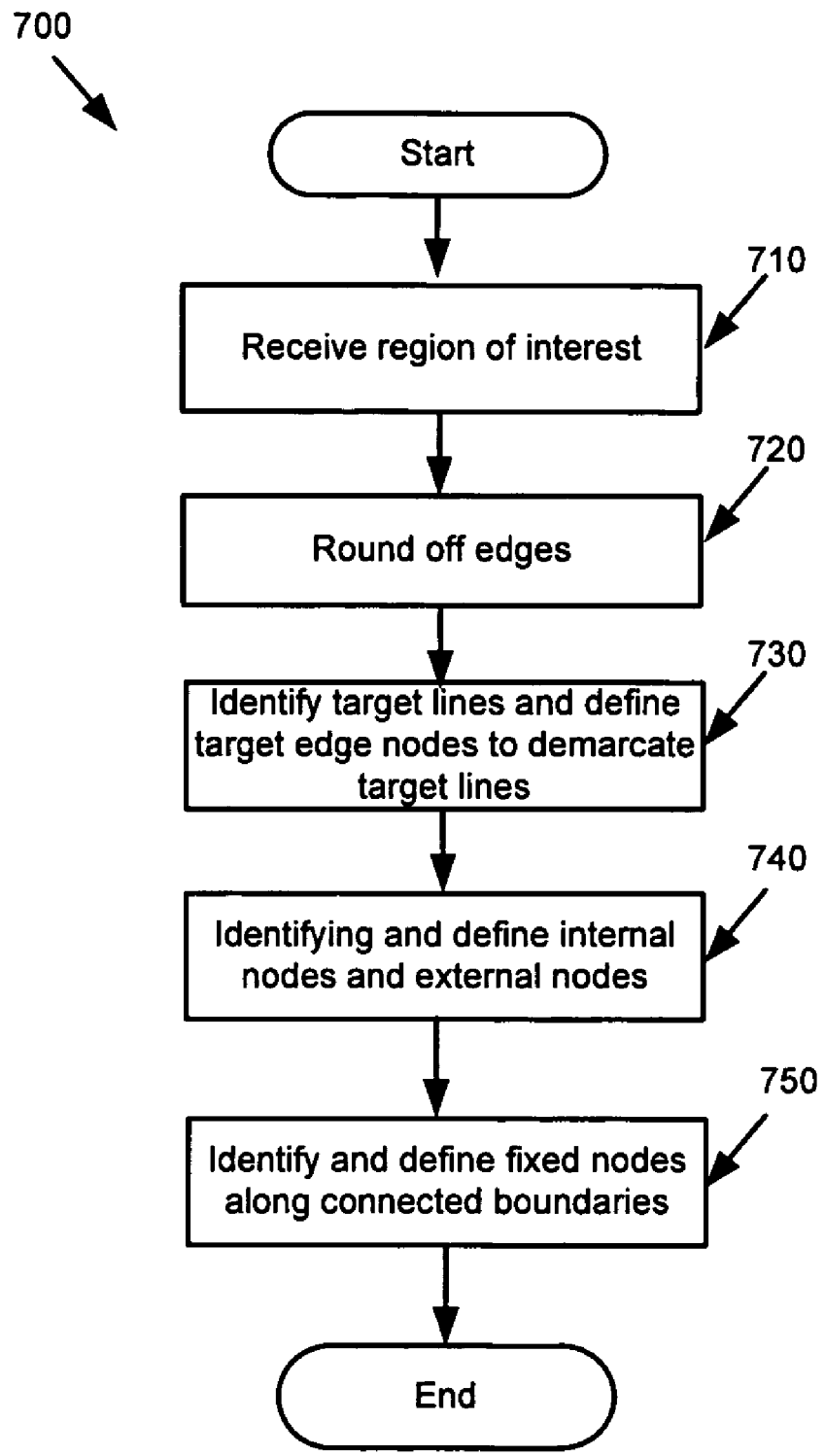
FIG. 7 describes a process for imposing a grid on a region of interest to divide the region into a set of nodes.
Figure 8:
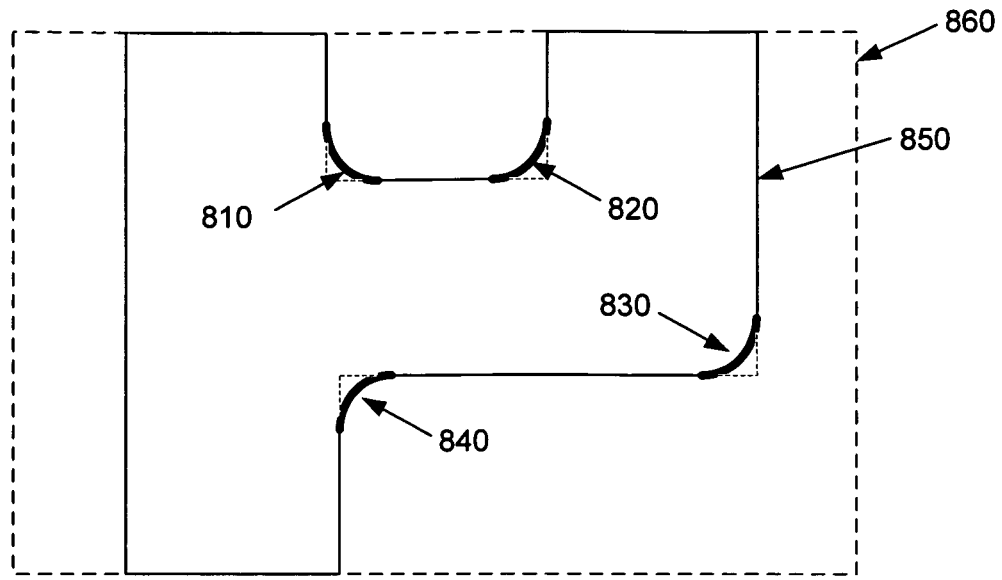
FIG. 8 illustrates the rounding of edges of a pattern within a region of interest in accordance with some embodiments.

FIG. 7 describes a process 700 for dividing a region of interest into a set of nodes. The process begins by receiving (at 710) the region of interest and processing (720) the patterns (e.g., portions of circuit modules, interconnect lines, etc.) appearing within the region of interest. Specifically, some embodiments process the patterns to create shapes that can achieve more realistic printability based on physical constraints (e.g., inability to print perpendicular corner segments) in the photolithographic printing process. One such processing procedure is to identify corner edges for patterns appearing within the identified region and to round the identified edges. FIG. 8 illustrates the rounding of edges 810-840 of a pattern 850 within a region of interest 860 in accordance with some embodiments.

Once the processing of the patterns is performed, the process then imposes a grid on the region by defining a set of nodes as described in steps 730 and 750 below. Different node types are used to demarcate different characteristics of the region represented by each node. Some embodiments utilize a coloring scheme to represent some such characteristics. Moreover, different coloring schemes can be used throughout different stages of the double patterning optimization. For instance, the description below may refer to some nodes as bright and dark to demarcate intensities for internal nodes from external nodes and later describe the same nodes using blue and red coloring where each of the red and blue colors corresponds to an exposure of a multi-exposure photolithographic process.

In some embodiments, edge lines for the patterns appearing within the region of interest are demarcated using a pair of nodes for the purpose of defining a threshold for acceptable edge placement errors. Accordingly, the process defines (at 730) internal target edge nodes and external target edge nodes with the distance between the nodes specifying the acceptable edge placement error. In some embodiments, an internal node represents a discretized space that falls within the bounds of a pattern or feature appearing within the region of interest and an external node represent a discretized space that falls outside the bounds of a pattern or feature. Furthermore, internal edge nodes represent the discredited space along the boundary or border of the pattern or feature.

Figure 9:
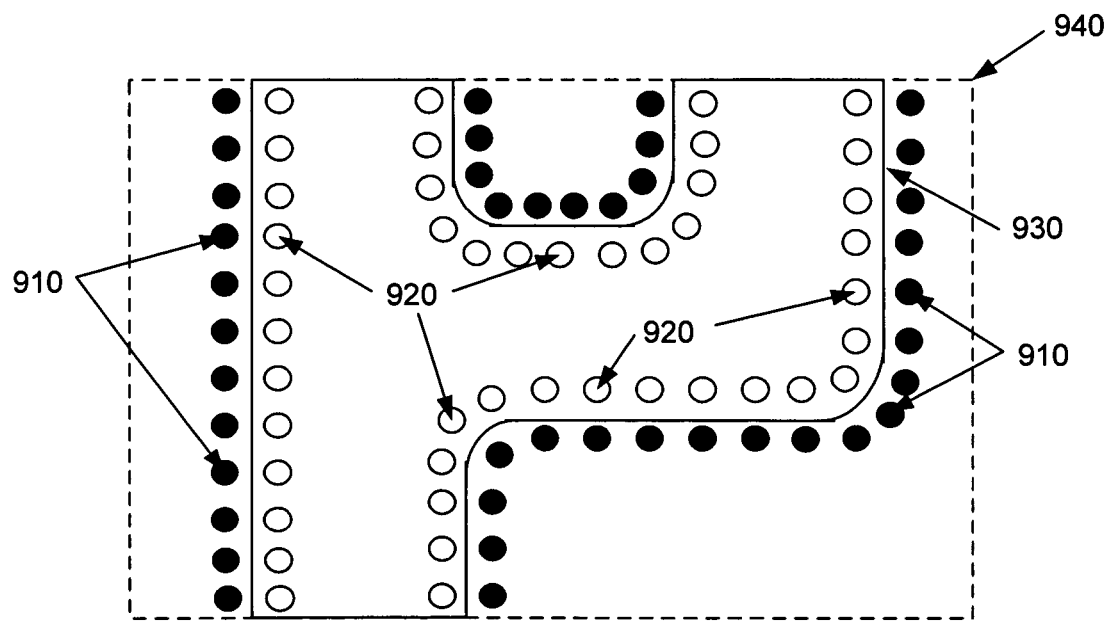
FIG. 9 illustrates the demarcation of edge lines for patterns appearing within a region of interest using sets of nodes in accordance with some embodiments.

FIG. 9 illustrates the demarcation of edge lines for patterns appearing within a region of interest using sets of nodes in accordance with some embodiments. As shown, outer nodes 910 and inner nodes 920 demarcate each edge of the pattern 930 appearing within the region of interest 940.

Figure 10:
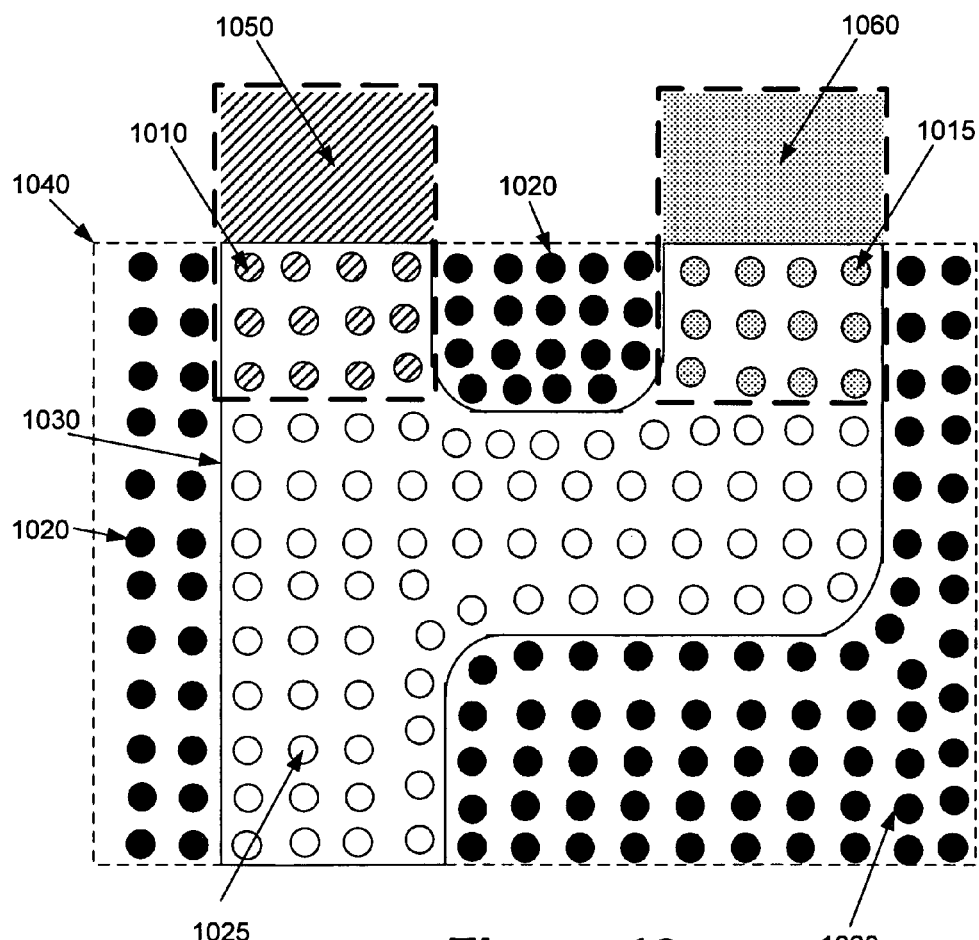
FIG. 10 illustrates defining sets of internal nodes and external nodes throughout a region of interest in accordance with some embodiments.

The process 700 also identifies and defines (at 740) internal nodes and external nodes over the remainder of the region of interest. FIG. 10 illustrates defining sets of internal nodes (e.g., 1010, 1015, and 1025) and external nodes (e.g., 1020) throughout the region of interest 1040 in accordance with some embodiments. In some embodiments, the sampling rate used to determine the number of internal nodes and external nodes has to equal or exceed the Nyquist sampling rate determined from the Nyquist sampling theorem. The Nyquist sampling theorem states that for a band limited signal (e.g., the optics of the photolithographic printing process), an equally spaced sampling frequency must exceed the maximum frequency of the band limited signal by at least a factor of two for the signal to be reconstructed without aliasing. The sampling rate is thus twice the sample frequency. It should be apparent to one of ordinary skill in the art that some embodiments modify the sampling rate based on other sampling theorems or based on the resources available to process the particular region of interest.

Some of these defined internal nodes can further be demarcated from other internal nodes. In some embodiments, "fixed" internal nodes are demarcated from "non-fixed" internal nodes. Accordingly, the process identifies and defines (at 750) fixed node types where possible.

FIG. 10 also illustrates the designation of fixed internal nodes from non-fixed internal nodes. As shown, a fixed internal node (e.g., node 1010 or 1015) is a node appearing at a boundary of a pattern 1030 within the region 1040 where the pattern 1030 is part of a feature that extends beyond the particular region of interest (e.g., segments 1050 and 1060). In some embodiments, a node is designated as a fixed node type, because portions of the feature that extend beyond the particular region have already been "fixed" to print with a particular exposure of a multi-exposure printing process. The node will be fixed to print with the same particular exposure in order to minimize "cuts" to a pattern and therefore reduce the number of intensity transitions that occur when printing the pattern. Accordingly, the fixed internal node 1010 will also be fixed to print in the same exposure as the portion 1050 extending beyond the particular region of interest 1040. Additionally, designating fixed nodes provide an indication in how to optimize the remainder of unfixed internal nodes defined over the region (e.g., reduce the number of transitions between exposures for adjacent nodes).

In some embodiments, the internal nodes must be bright and the external nodes must be dark. This demarcation of internal nodes from external nodes indicates nodes that require intensity values that exceed a given threshold for photolithographic printing. For instance, this demarcation may be used to define printing of a contact layer or metal layer using some positive photoresist. However, it should be apparent to one of ordinary skill in the art that the inverse is similarly applicable to some embodiments. For instance, some embodiments require external nodes to be bright and internal nodes to be dark when reversing the polarity used for the photolithographic printing.

B. Constraint Assignment

After defining the nodes over the region of interest, some embodiments define one or more design constraints to apply to each node based on the node type. In some embodiments, the constraints are defined in terms of intensity values for each exposure of a multi-exposure photolithographic printing process as described in further detail below. The following description provides an exemplary list of constraints. This listing is not meant to be an exhaustive listing of constraints. As such, it should be apparent to one of ordinary skill in the art that various other constraints may be assigned to some or all such nodes.

Internal nodes represent portions of a pattern within a particular region of interest. In some embodiments, these nodes require photolithographic printing in at least one exposure of a multi-exposure photolithographic printing process. Accordingly, a constraint is assigned to the internal nodes for each exposure to determine whether the node is printed in at least one exposure.

Figure 11:
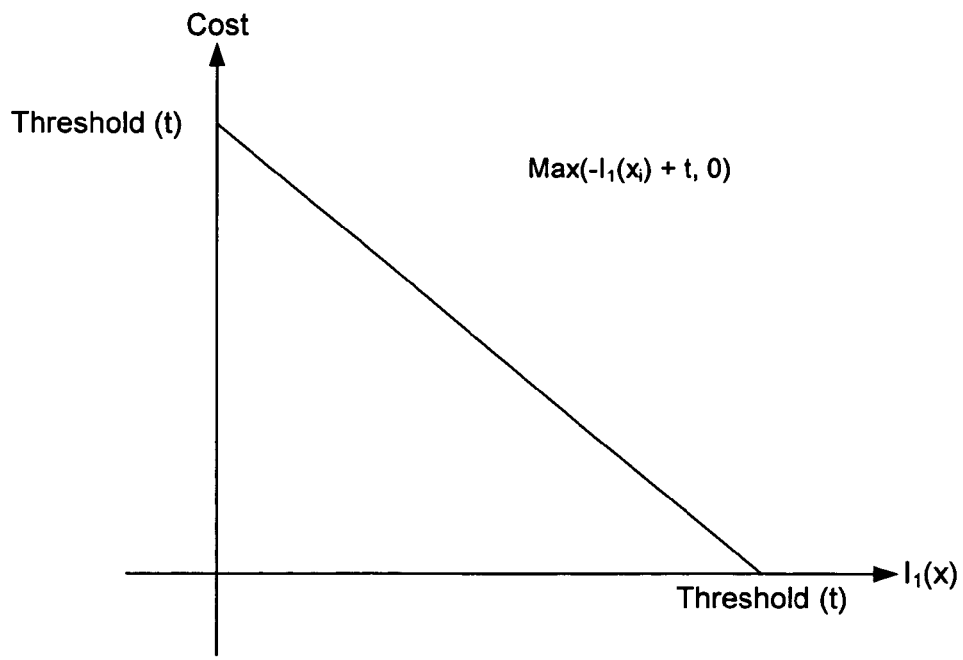
FIG. 11 presents a constraint for costing an internal node that is fixed to a particular exposure in accordance with some embodiments.

For fixed internal nodes that are fixed to a particular exposure, only one such constraint is needed to ensure that the intensity for the particular exposure is sufficient to print the node. FIG. 11 presents a constraint for costing an internal node that is fixed to a particular exposure in accordance with some embodiments. A graph pictorially represents the constraint. As shown, intensity values of the exposure are illustrated across the x-axis of the graph, cost values are illustrated across the y-axis of the graph, and a threshold is illustrated to specify the set of intensity values that incur no cost penalty. Specifically, when the intensity exceeds the threshold, there will be no cost or a zero cost. For any fixed internal node where the intensity does not exceed the threshold there will be a non-zero cost associated with the node. Such a cost signifies that the printing process is unable to correctly print the portion of the pattern represented by the node. This could result in any number of photolithographic errors such as pinching, necking, and various other printing errors that often lead to "opens" between otherwise connected circuits or "shorts" between otherwise unrelated circuits in the physical implementation.

A cost function term can be used to express the quantification of the cost constraint illustrated in FIG. 11. In some embodiments, the cost function term associated with the graph illustrated in FIG. 11 is $$\text{Max}(-I_1(x_i)+t, 0) \qquad (1)$$

where $I_1(x_i)$ represents the intensity value at node $x_i$ and t represents the threshold.

Figure 12:
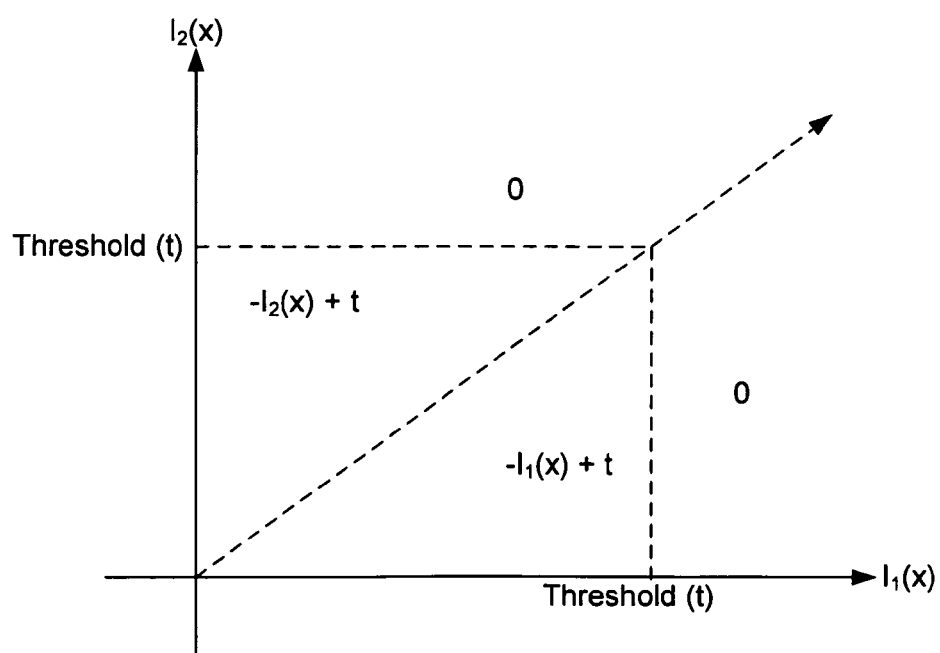
FIG. 12 illustrates a constraint used to cost an internal node that is not fixed to any particular exposures in accordance with some embodiments.

As noted above, for internal nodes that are not fixed to a particular exposure, costing is performed in relation to all intensity values for all possible exposures to which the node may be decomposed onto. FIG. 12 illustrates a constraint used to cost an internal node that is not fixed to any particular exposures in accordance with some embodiments. As shown, the photolithographic process is performed in two exposures. Accordingly, a constraint is specified for each exposure. When the intensity defined for either exposure exceeds the threshold needed to print the node, then the constraint cost for that node is satisfied and a zero value is assigned. In FIG. 12, the x-axis of the graph represents intensity values defined for a first exposure and the y-axis of the graph represents intensity values defined for a second exposure. When either intensity value exceeds the threshold, a zero cost is assigned to the node.

However, when neither threshold is exceeded, then the printing process will not correctly print the portion of the pattern represented by the node. In some embodiments, the cost function term associated with the constraint illustrated in the graph of FIG. 12 is $$\text{Max}(-\text{Max}(I_1(x_i), I_2(x_i))+t, 0) \qquad (2)$$

where $I_1(x_i)$ represents a first intensity value at node $x_i$ when printing with a first exposure of multi-exposure photolithographic printing process, $I_2(x_i)$ represents a second intensity value at node $x_i$ when printing with a second exposure of multi-exposure photolithographic printing process, and t represents the threshold.

Figure 13:
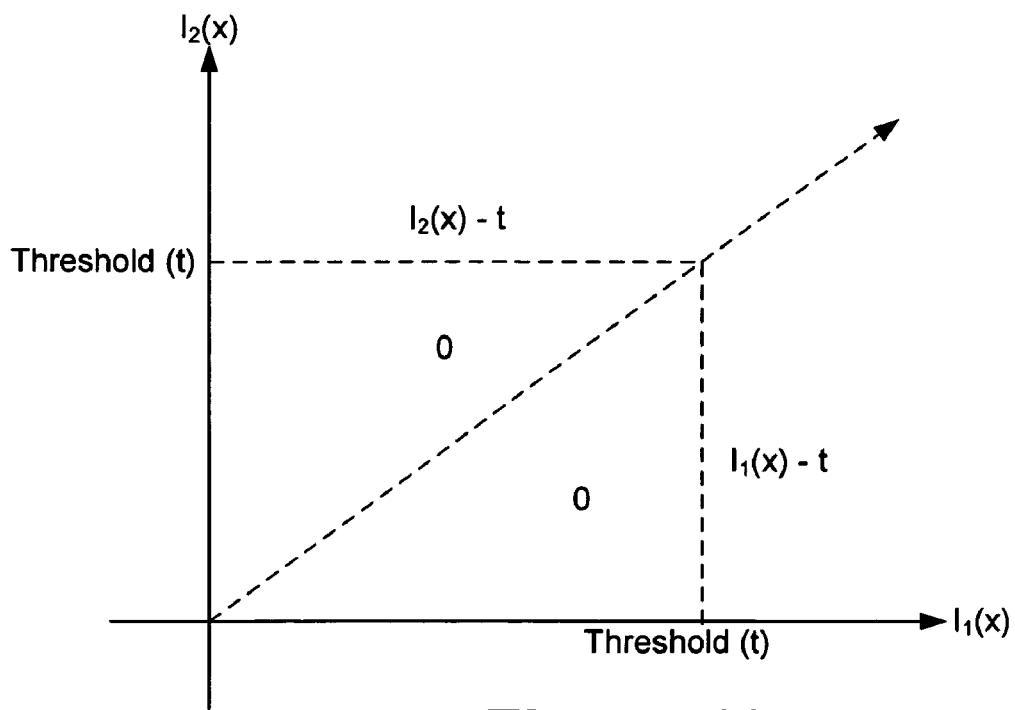
FIG. 13 illustrates a constraint used to cost an external node in accordance with some embodiments.

External nodes represent portions within the particular region of interest that should not be printed. Accordingly, a constraint is assigned to the external nodes to ensure that the intensity associated with the node does not exceed an intensity threshold for printing the external nodes. FIG. 13 illustrates a constraint used to cost an external node in accordance with some embodiments. As shown, the photolithographic process is performed in two exposures (i.e., two intensities). Accordingly, a cost is computed for the external node based on each exposure. When the intensity defined for either exposure at the external node exceeds the threshold, then the constraint cost for that node is violated and a non-zero value is assigned to the node. In FIG. 13, the x-axis of the graph represents intensity values defined for a first exposure and the y-axis of the graph represents intensity values defined for a second exposure. In some embodiments, the cost function term associated with the constraint illustrated in the graph of FIG. 13 is $$\text{Max}(\text{Max}(I_1(x_i), I_2(x_i))-t, 0) \quad (3)$$

where $I_1(x_i)$ represents a first intensity value at node $x_i$ when printing with a first exposure of multi-exposure photolithographic printing process, $I_2(x_i)$ represents a second intensity value at node $x_i$ when printing with a second exposure of multi-exposure photolithographic printing process, and t represents the threshold.

Figure 14:
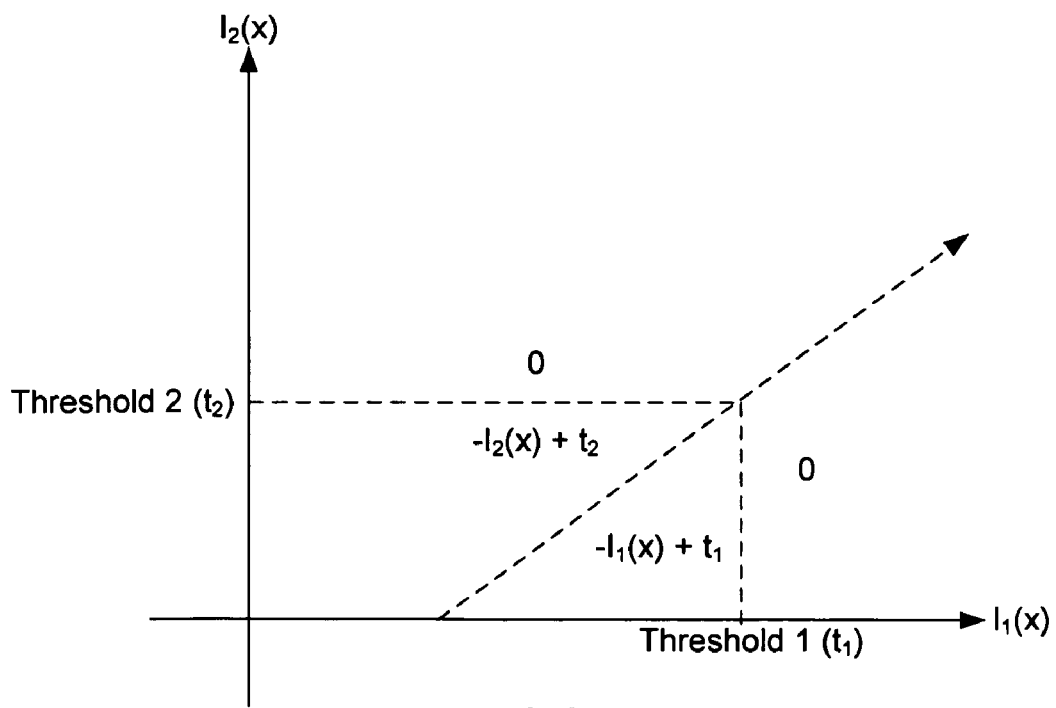
FIG. 14 illustrates a constraint and corresponding cost function term in accordance with some embodiments defining two separate thresholds.

It should be apparent to one of ordinary skill in the art that in some embodiments separate thresholds are specified for each intensity value. FIG. 14 illustrates a constraint and corresponding cost function term in accordance with some embodiments defining two separate thresholds.

FIG. 13 illustrates a constraint used to cost an external node in accordance with some embodiments. In this figure, $t_1$ is a larger threshold than $t_2$. Accordingly, $I_1(x_i)$ must have a higher intensity value in order to satisfy $t_1$ than does $I_2(x_i)$ for satisfying $t_2$. The cost function term associated with the constraint illustrated in the graph of FIG. 14 is $$\text{Max}(\text{Max}(-I_1(x_i)+t_{i,-t_2}(x_i)+t_2), 0) \quad (4)$$

Any number of additional constraints may be associated to one or more node types. For instance, some embodiments specify a constraint to place intensity bounds at each node such that first and second intensity images must be bounded between values of 0 and 1. The following cost function terms specify such constraints:

$$\text{Max}(-I_1(x_i), 0) \quad (5)$$

$$\text{Max}(-I_2(x_i), 0) \quad (6)$$

$$\text{Max}(I_1(x_i)-1, 0) \quad (7)$$

$$\text{Max}(I_2(x_i)-1, 0) \quad (8)$$

Figure 15:
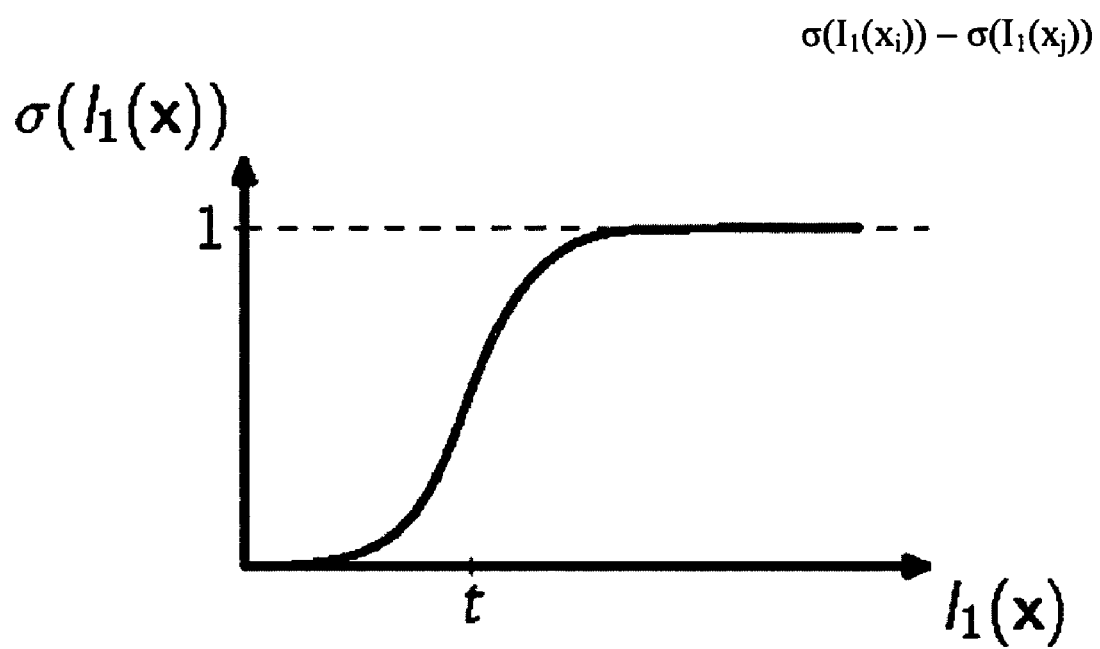
FIG. 15 illustrates a constraint imposed on some adjacently defined internal nodes and its corresponding cost function term in accordance with some embodiments.

Some embodiments further assign a constraint to some adjacently defined internal nodes in order to define a cost when the intensity between the adjacent internal nodes switches. FIG. 15 illustrates one such constraint and its corresponding cost function term in accordance with some embodiments. As shown, the constraint penalizes transitions to different exposures for neighboring nodes. The cost function term associated with this constraint is $$\sigma(I_1(x_i))-\sigma(I_1(x_j)) \quad (9)$$

where $\sigma$ is a sigmoid function such that $\sigma(I)$ is close to a value of 0 for intensities I that are less than the threshold t, and $\sigma(I)$ is close to a value of 1 for intensities I greater than the threshold t.

C. Defining the Cost Function

Figure 16:
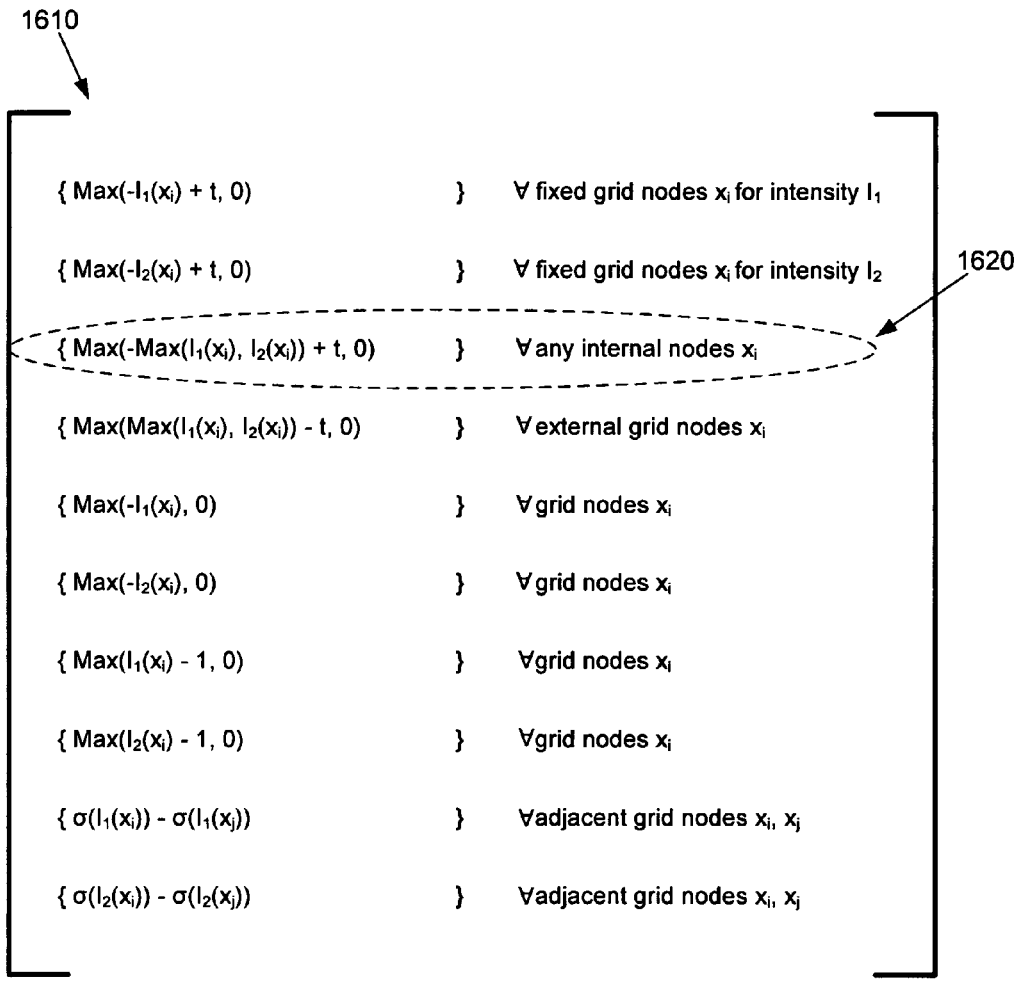
FIG. 16 illustrates a cost function in accordance with some embodiments.

From the various constraints assigned to each node, some embodiments derive an overall cost function in terms of the intensity values. FIG. 16 illustrates a cost function 1610 in accordance with some embodiments. Each row within the cost function 1610 represents multiple entries in a cost function vector, with one entry for each node of the appropriate type. It should be apparent to one of ordinary skill in the art that various other cost constraints may be included in addition to or in place of the enumerated constraints within the illustrated cost function. Moreover, it should be apparent that not all constraints shown within the cost function are applicable to all node types. In fact, certain constraints are exclusive to certain node types.

Figure 17:
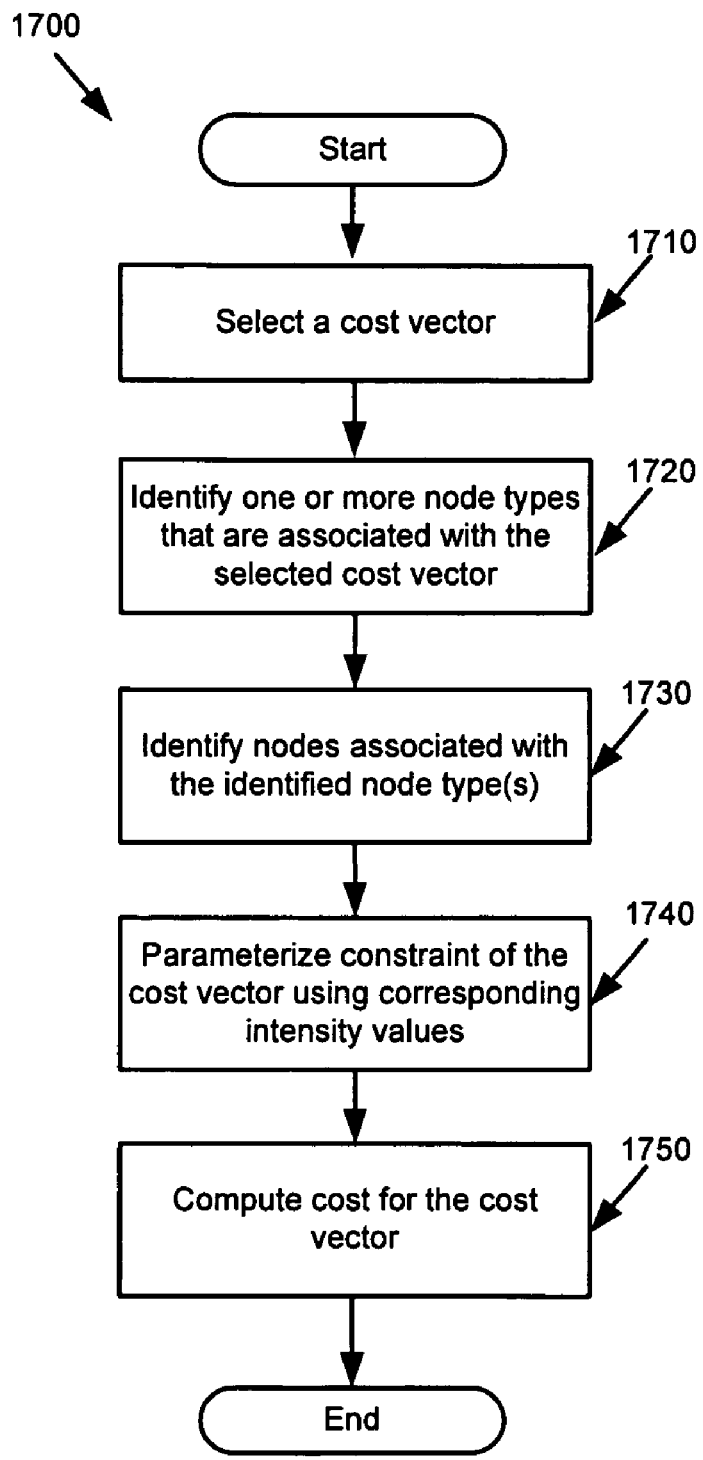
FIG. 17 presents a process for computing a particular cost vector of the cost function in accordance with some embodiments.

FIG. 17 presents a process 1700 for computing a particular cost vector (e.g., 1620) of the cost function 1610 in accordance with some embodiments. The process 1700 selects (at 1710) a cost vector. The process identifies (at 1720) one or more node types that are associated with the selected cost vector. For instance, node types include internal nodes, fixed internal nodes, external nodes, boundary nodes, bright nodes, darks nodes, etc. Furthermore, each node can belong to one or more node types.

The process then identifies (at 1730) the nodes (and therefore their corresponding constraints) associated with the identified node type(s). The process parameterizes (at 1740) the constraints associated with each node in the cost vector using selected intensity values and computes (at 1750) a cost that is determined from the parameterized constraints for all identified nodes of the cost vector.

Figure 18:
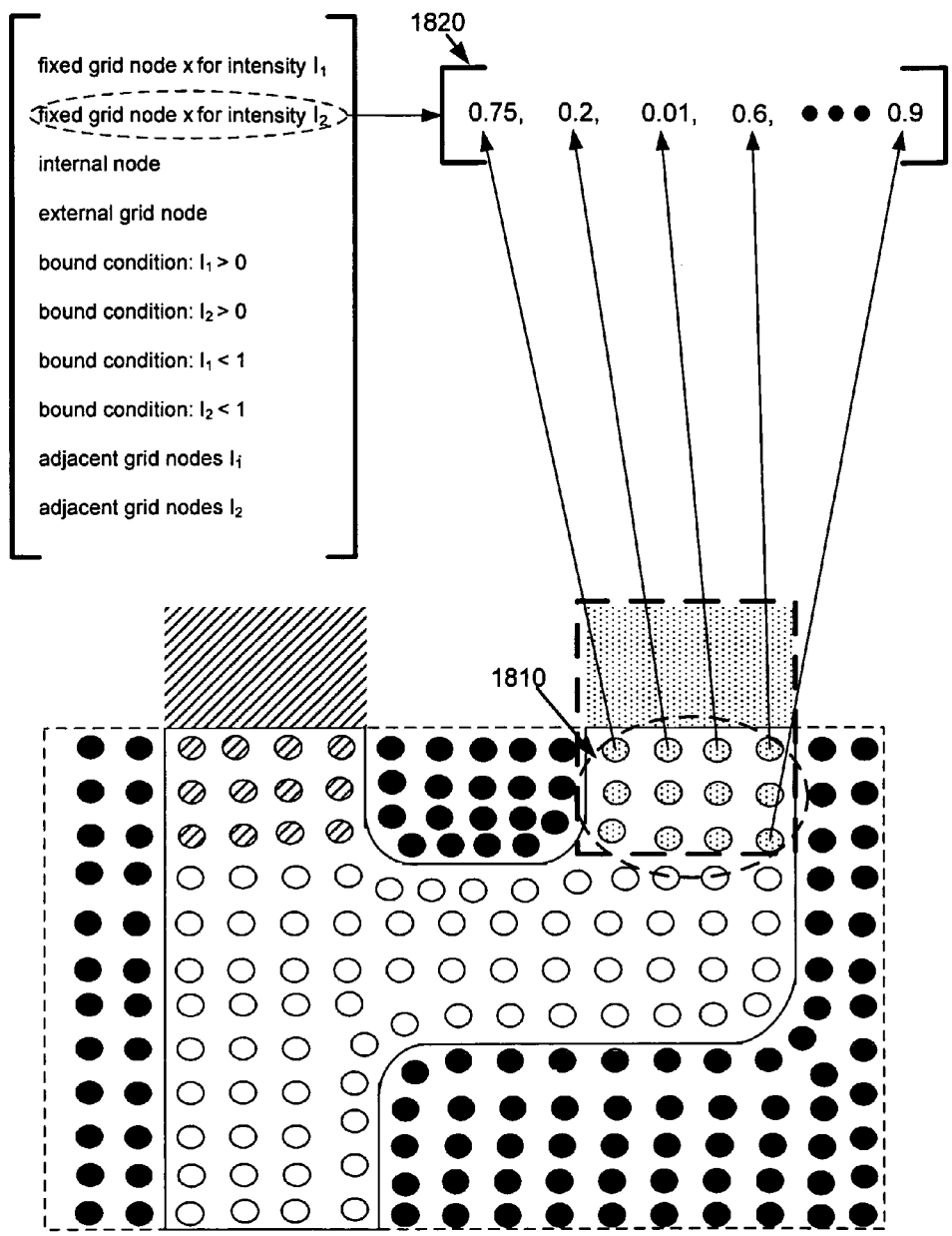
FIG. 18 illustrates computing the cost vector for internal nodes that are fixed to a second exposure in accordance with the process of FIG. 17.

As an example, FIG. 18 illustrates computing the cost vector for internal nodes that are fixed to a second exposure in accordance with the process 1700 of some embodiments. Accordingly, all nodes 1810 corresponding to the node type for internal nodes fixed to the second exposure are identified. The parameterized constraints for each node are illustrated in the enumerated cost vector 1820. The constraints are parameterized using intensity values corresponding to each node in the vector. Each value can then be summed to compute the cost for the cost vector.

III. Optimizing the Cost Function

Some embodiments optimize the cost function to identify an optimal intensity image for each exposure of a multi-exposure photolithographic process such that the union of the patterns created/printed from each exposure intensity image most closely approximates the patterns within the region of interest. Some embodiments define the intensity values for each intensity image (i.e., a particular exposure of a multi-exposure photolithographic process) through a Fourier expansion. In so doing, the intensities are mapped to a spatial frequency domain allowing some embodiments to bind and minimize the number of feasible solutions in the solution space. As a result, some embodiments are able to ensure that each feasible solution represented by the Fourier expansion conforms with the band limitation of a multi-exposure photolithographic printing process.

Figure 19:
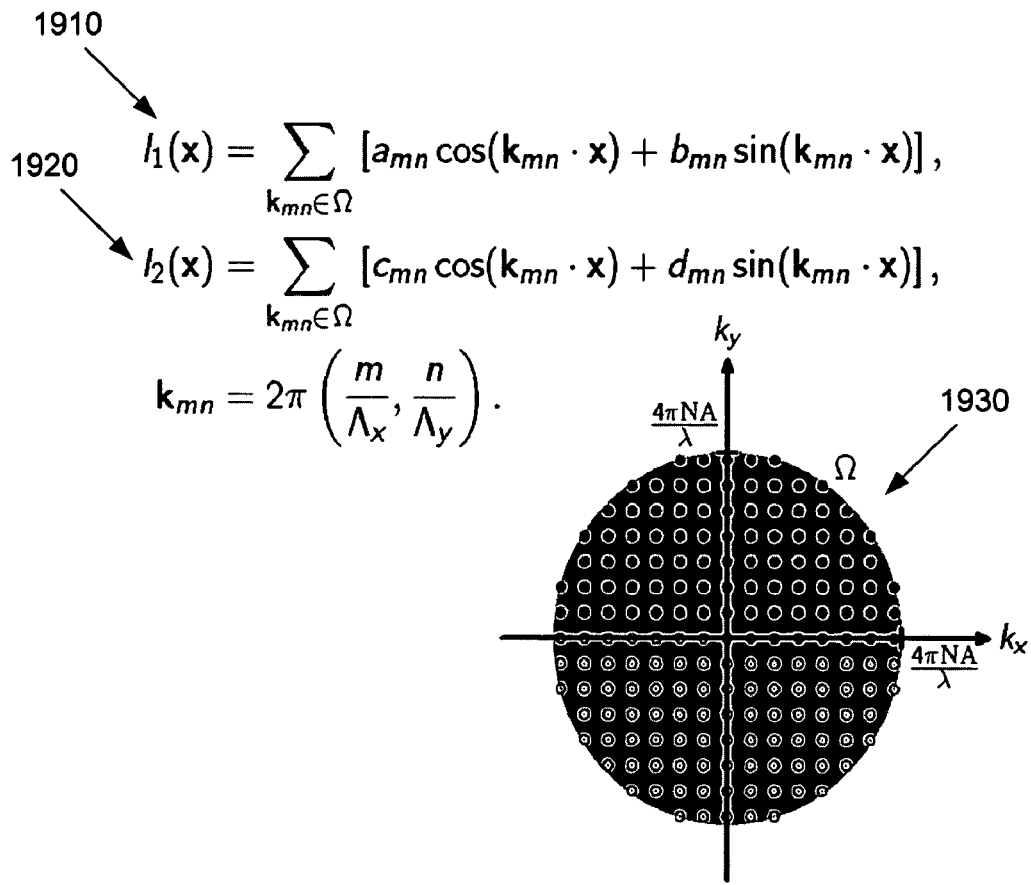
FIG. 19 illustrates a Fourier expansion for two separate intensities and in accordance with some embodiments.

FIG. 19 illustrates a Fourier expansion for two separate intensities 1910 and 1920 in accordance with some embodiments. As shown, each intensity 1910 or 1920 is defined through a summation of different sets of cosine and sine functions. The coefficients $a_{mn}$, $b_{mn}$, $c_{mn}$, and $d_{mn}$ represent the optimization variables for optimizing the cost function. Specifically, the coefficients are associated with points in the frequency plane 1930 that are properly band limited. Therefore, when altering any one of the coefficients, different intensity values can be explored for each node within the cost equation while ensuring that the resulting solutions conform with the frequency constraint of the printing process.

The $k_{mn}$ coefficient of the Fourier expansion represents the spatial frequency or oscillation as a function of position. As shown, $k_{mn}$ is defined as $$2*\pi*(m/\Lambda_x, n/\Lambda_y) \quad (10)$$

As is known in the art, the Fourier theorem states that any periodic function (such as light intensity) can be represented by the sum of a series of amplitudes and phases of sine waves of one frequency and integer multiples of that frequency. Accordingly, in the Fourier expansions 1910 and 1920 of the two intensities $I_1$ and $I_2$, $\Lambda_x$ corresponds to the period that the intensity image repeats itself in the x direction and $\Lambda_y$ corresponds to the period that the intensity image repeats itself in the y direction. To visualize this, in FIG. 19, $K_x$ shows how fast Fourier components oscillate along the x axis. Similarly, $K_y$ show how fast Fourier components oscillate along the y axis. The further the distance from the center of the frequency plane 1930 the faster the oscillations of the component.

This assumption of periodicity, which is necessary for finite Fourier analysis, causes artificial constraints to be imposed on the intensity images near the boundary of the repeating image. In order to prevent this, the period of repetition needs to be made larger than the region of interest, so that opposite edges of the region of interest do not interact. Alternatively, in the case that the region of interest is a pattern that cyclically repeats through the layout or through a portion of the layout, the period of repetition may be made equal to the size of the region of interest.

It should be apparent to one of ordinary skill in the art that differently defined frequency planes may be used in conjunction with specifying the feasible set of intensity values. For example, the circular shape of the region, $\Omega$, is the largest area of the allowed frequencies. The actual area, however, can be smaller than the circle, $\Omega$.

Figure 20:
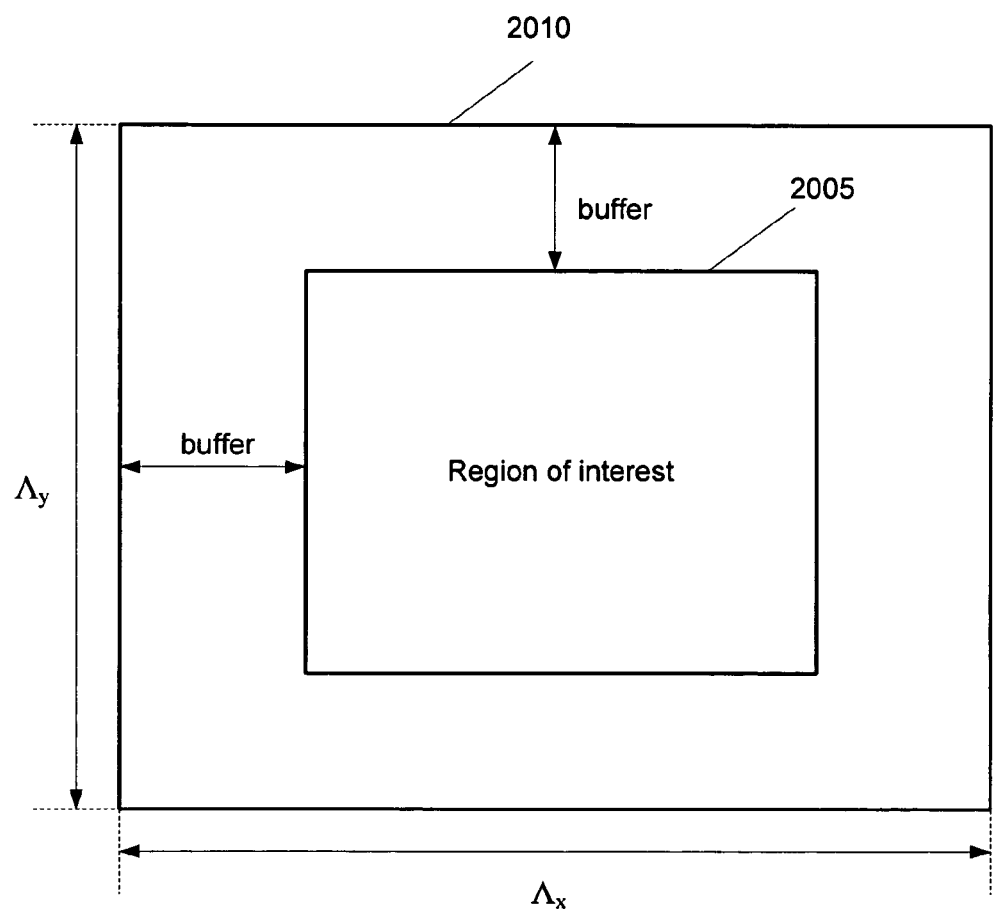
FIG. 20 illustrates an example of a region of interest in some embodiments.

FIG. 20 illustrates an example of a region of interest 2005 in some embodiments. $\Lambda_x$ and $\Lambda_y$ correspond to the intensity image periodically repeating itself in the x and y directions respectively. In order for the repeating images to be out of the region of interest 2005, the region of interest has to be small enough to create buffer areas along the x and y coordinates, as shown in FIG. 20. In some embodiments, the buffer length (or width) has to be larger than $$C\frac{\lambda}{NA} \quad (11)$$

where C is a constant, $\lambda$ is the exposure wavelength and NA is the numerical aperture and is the refractive index of the optical medium times the sine of the largest angle of incidence on the wafer. In the case where the region of interest is a pattern that cyclically repeats through the layout or through a portion of the layout, $\Lambda_x$ and $\Lambda_y$ become the dimensions of that cyclically repeating pattern.

In some embodiments, constant C is selected to be larger than or equal to 2 in order to make a large enough buffer area 2010 around the region of interest 2005 to prevent the repetition of the image caused by Fourier analysis to cause artificial constraints to be imposed on the intensity images near the boundary of the region of interest.

By enumerating the coefficients $a_{mn}$, $b_{mn}$, $c_{mn}$, and $d_{mn}$ an intensity image is obtained for the region of interest. The intensity image represents a feasible exposure that can be obtained based on the constraints of the photolithographic process. Specifically, the intensity image maps the region of interest to a continuous set of increasing and decreasing intensity values which when applied to a threshold filter defines what is printable and the accuracy of the printability (e.g., does the printed feature have a sufficient width). In other words, an intensity image provides a mathematical simulation of a feasible exposure that is achievable based on quantifiable constraints of the photolithographic process.

By parameterizing the cost function with the intensity values, some embodiments determine the similarity between an achievable solution and a desired target specified within the design layout. Therefore, some embodiments must search through the set of feasible solution in order to determine the best such solutions.

Figure 21:
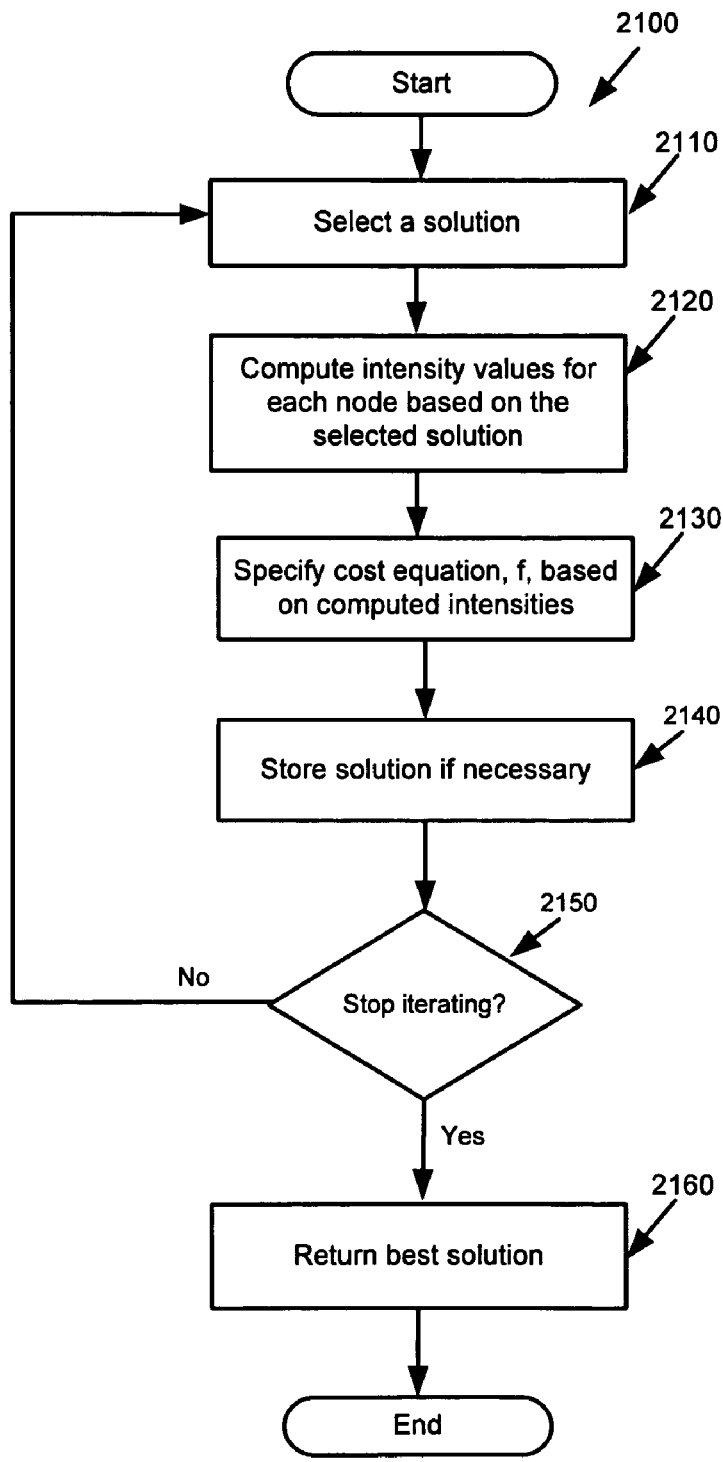
FIG. 21 presents a process for identifying optimal intensity images for each exposure of a multi-exposure photolithographic process in accordance with some embodiments.

FIG. 21 presents a process 2100 for identifying optimal intensity images for each exposure of a multi-exposure photolithographic process in accordance with some embodiments. In some embodiments, the process 2100 is performed in conjunction with multi-patterning decomposition. The process begins by selecting (at 2110) a solution for the Fourier expansion from a feasible solution space as described above. The solution comprises selecting values for each of the optimization variables (e.g., $a_{mn}$, $b_{mn}$, $c_{mn}$, $d_{mn}$) of the Fourier expansion. In some embodiments, the optimization variables are initialized based on what is known about fixed internal nodes. Specifically, it is known that each such node must be printed during a particular exposure. As such, a starting point is provided from which the cost function may be minimized.

The process then uses the solutions to compute (at 2120) intensity values for each intensity image. The process uses the computed intensity values to specify (at 2130) the cost function by parameterizing the cost function with intensity values. In so doing, the process realizes a cost for the intensity images. The process then stores (at 2140) the solution when it is necessary. In some embodiments, only solutions that are more optimal than all previous iterations will be stored. In some other embodiments, other solutions are retained from which a determination is subsequently made as to which solution is the best solution.

The process then determines (at 2150) whether to continue iterating. In some embodiments, the process halts iterations upon an exhaustion of resources. This may include exceeding a time limit for identifying an optimal solution. Additionally, this may include identifying a solution with a sufficient cost result that satisfies all design constraints of the printing process. Accordingly, when the process determines that no additional iterations are needed, the process returns (at 2160) the best solution and the process ends. The returned solution in some embodiments might not necessarily be the best possible solution, but only an optimal one given the number of iterations and/or resources expended.

Otherwise, the process selects a new solution to examine by returning to step 2110 that was described above. In some embodiments, selecting a new solution includes modifying one or more of the optimization variables (e.g., $a_{mn}$, $b_{mn}$, $c_{mn}$, $d_{mn}$) in a manner that will minimize the cost function.

In some embodiments, the optimization iterations are performed in conjunction with or solely using an optimization algorithm such as the Levenberg-Marquardt algorithm. However, it should be apparent to one of ordinary skill in the art that other such optimization algorithms are applicable to the process 2100 described above to arrive at a set of optimal intensity images.

Some embodiments then derive an intensity graph for the region of interest from the resulting optimal solution. In some embodiments, this entails actual generation of the intensity images, an example of which is illustrated in FIG. 5. In some embodiments, the intensity graphs are used to specify a decomposition for the region of interest by defining a coloring for the patterns appearing within the region of interest such a first coloring over sections of the patterns identifies polygons to be printed using a first exposure of a multi-exposure photolithographic printing process and a second coloring over sections of the patterns identifies polygons to be printed using a second exposure of a multi-exposure photolithographic printing process. In some embodiments, the decomposition of the polygons is performed by a polygon generator.

Figure 22:
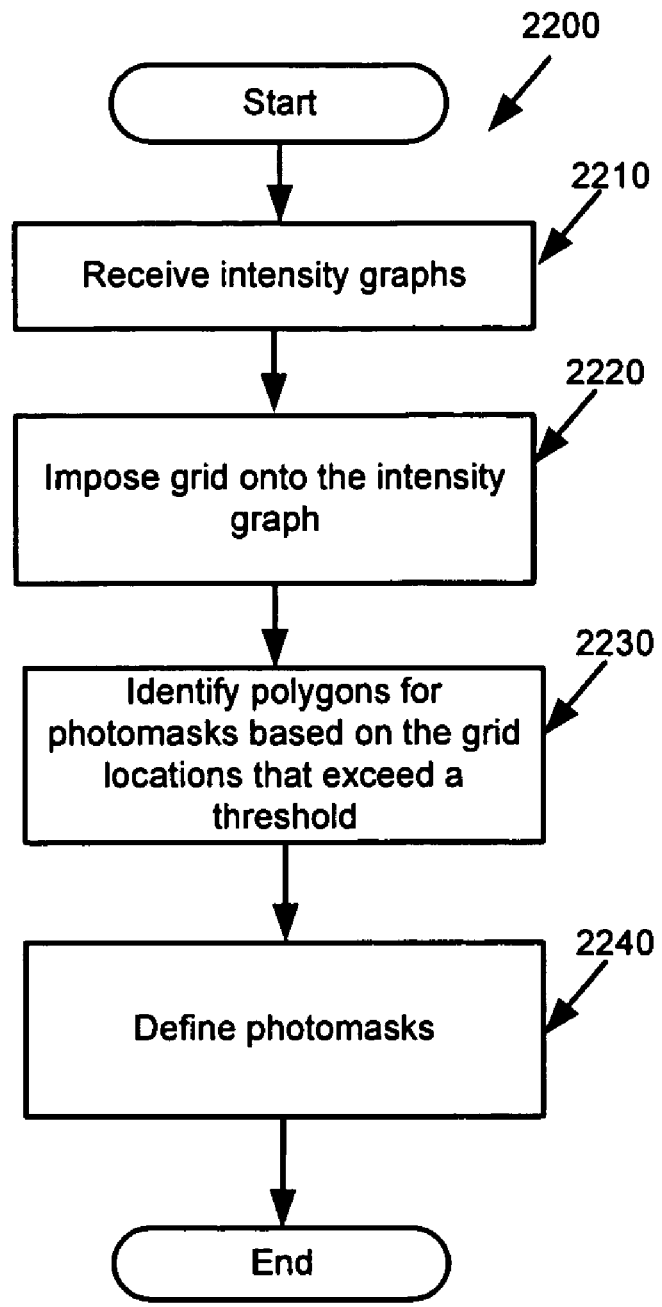
FIG. 22 illustrates a process performed by the polygon generator in accordance with some embodiments.

FIG. 22 illustrates a process 2200 performed by the polygon generator in accordance with some embodiments. The process begins when the polygon generator receives (at 2210) one intensity graph for each exposure of a multi-exposure photolithographic process. The process then imposes (at 2220) a grid on the intensities graph. This grid can be the same, coarser, or finer grid than that used to define the region with the nodes.

From the grid, the process identifies (at 2230) the sub-patterns or polygons used to define a photomask to be used in the photolithographic printing of the region. Each point of the sub-pattern or polygon is determined by comparing the intensity of a node on the grid against a threshold intensity value. Nodes with intensities that exceed the threshold become part of the sub-pattern or polygon and nodes with intensities lower than the threshold are outside the sub-pattern or polygon.

The process then defines (at 2240) the photomask to be used in an exposure of a multi-exposure printing process based on the intensity and threshold determinations that yielded the sub-patterns. The sub-patterns from each particular intensity graph define each photomask. Specifically, some embodiments utilize an EBeam process to etch the photomask with the polygons at the specified grid locations. In some such embodiments, the sub-patterns define the shapes to be etched into the photomask whereas in other embodiments the sub-patterns are mapped to the photomask using various optical proximity correction techniques and/or sub-resolution assist features (e.g., scatter bars, OAI, etc.).

IV. Software Architecture Overview

Figure 23:
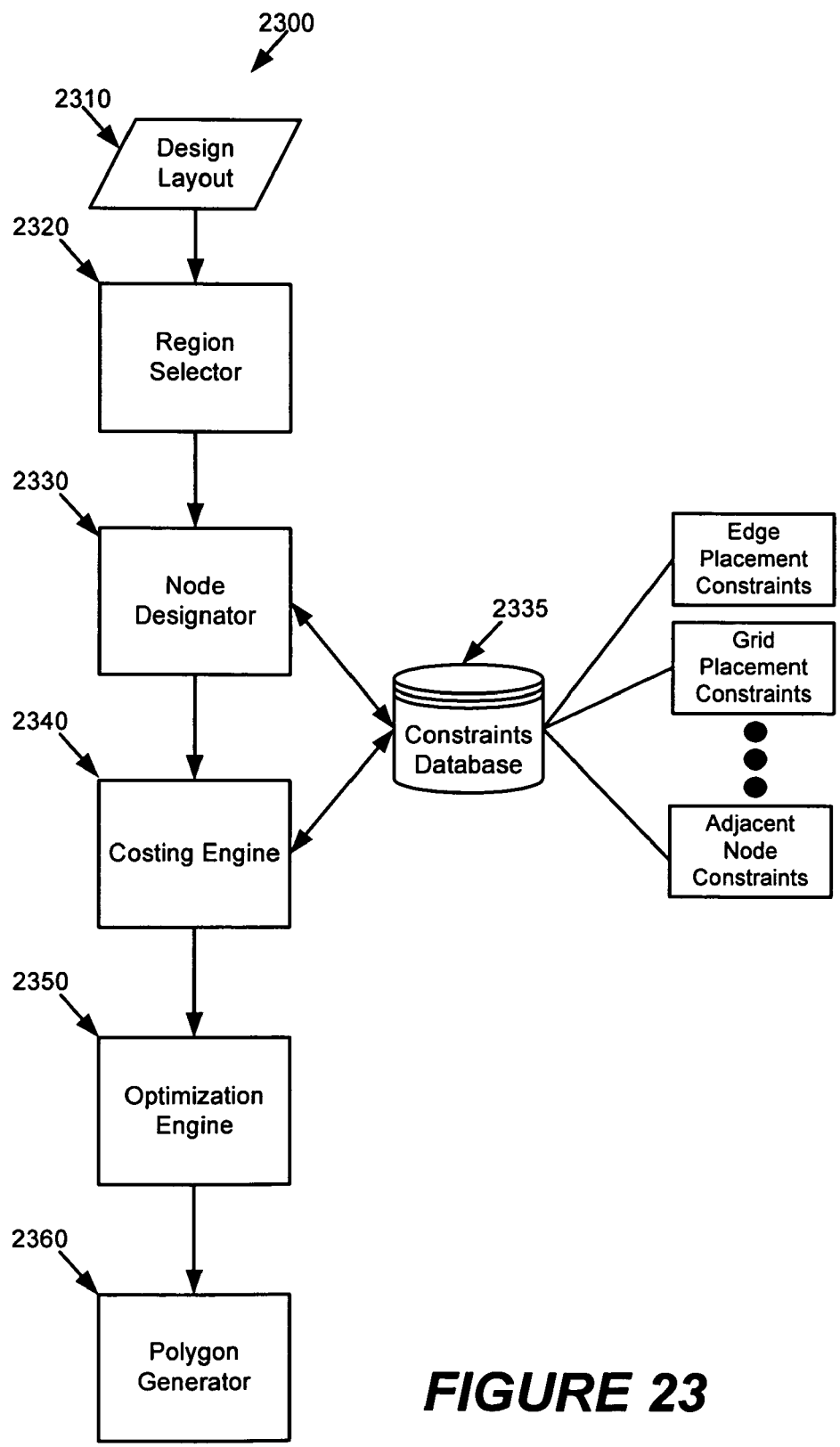
FIG. 23 presents a conceptual diagram of the software architecture for implementing the double patterning optimization method of some embodiments of the invention.

FIG. 23 presents a conceptual diagram of the software architecture 2300 for implementing some embodiments of the invention. As shown, the architecture 2300 processes a design layout 2310 using: (1) a region selector 2320, (2) a node designator 2330, (3) a constraints database 2335, (4) a costing engine 2340, (5) an optimization engine 2350, and (6) a polygon generator 2360.

In some embodiments, the region selector 2320 indentifies the particular regions of interest within the design layout 2305. In some embodiments, the region selector 2320 operates in conjunction with a global optimization module. In some such embodiments, the global optimization module may be used to initially decompose various regions of the design layout. For those complex regions of the design layout 2310 that the global optimization module cannot optimize, the global optimization module marks such regions and defers processing of the marked regions such that the marked region are processed in accordance with some embodiments of the invention. Accordingly, the global optimization module is not necessary to the operation of some embodiments.

Figure 24:
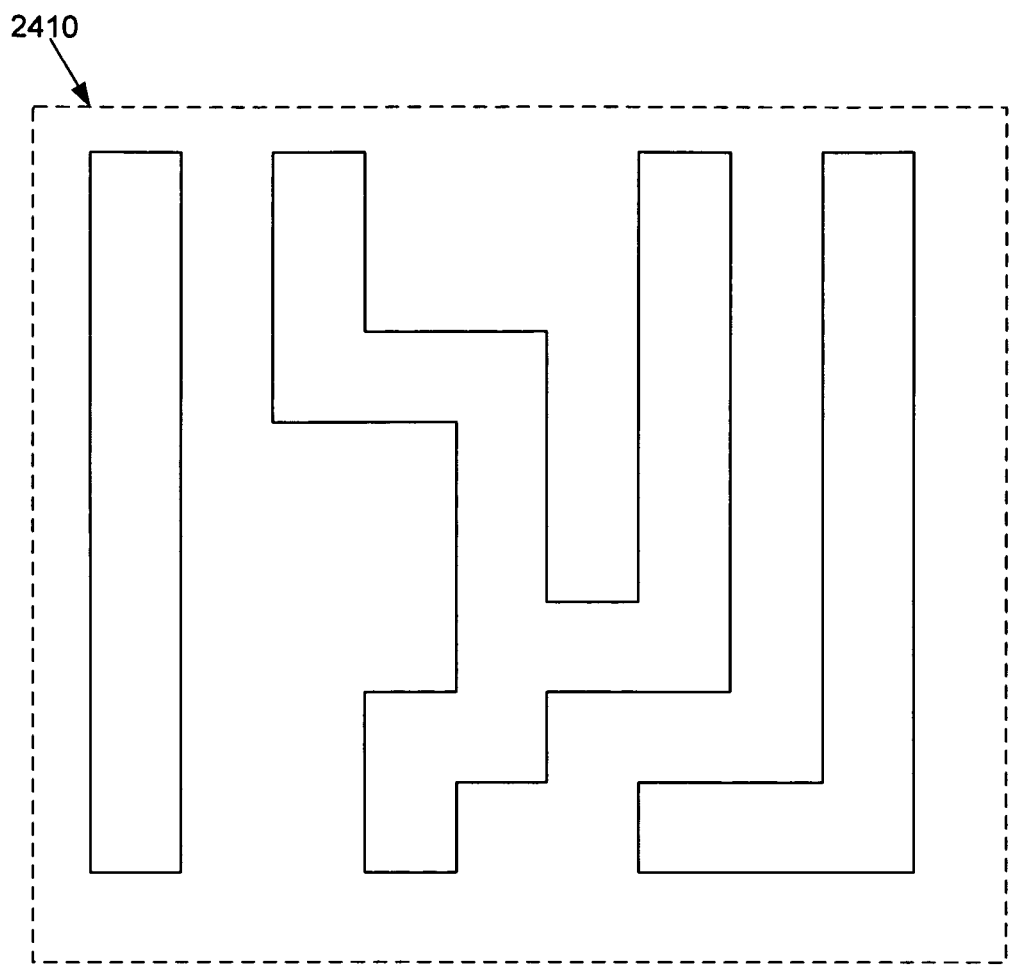
FIG. 24 illustrates a region of interest that has been selected for multi-exposure intensity optimization as encompassing an entire design layout or layer of the design layout.
Figure 25:
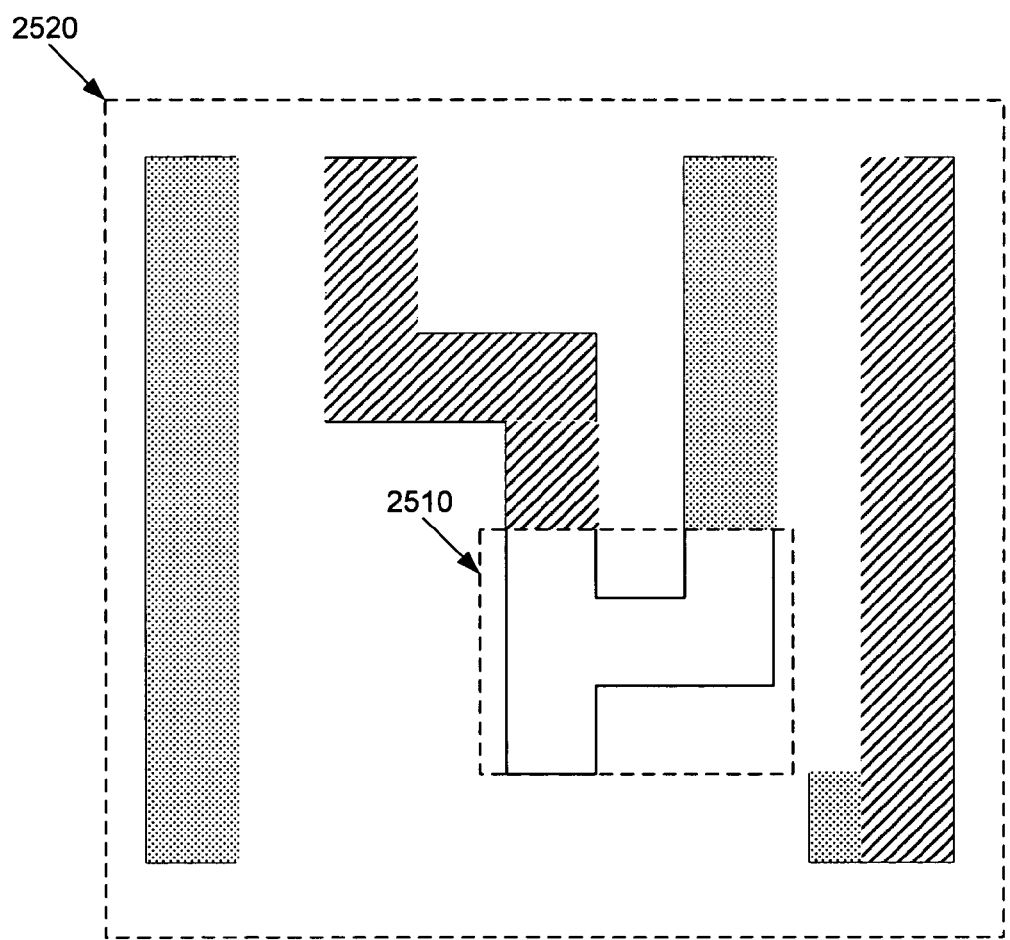
FIG. 25 illustrates a region of interest that has been selected for multi-exposure intensity optimization as encompassing only a spatial sub-region of a layer of a design layout.

In other words, the double patterning optimization technique of some embodiments is scalable to perform over particular regions of interest in a layer of a layout design, entire layers of the layout design, or over the entire layout design. For instance, FIG. 24 illustrates a region of interest 2410 that has been selected for multi-exposure intensity optimization as encompassing an entire design layout or layer of the design layout. FIG. 25 illustrates a region of interest 2510 that has been selected for multi-exposure intensity optimization as encompassing only a spatial sub-region of a layer of a design layout 2520.

Once the region of interest has been identified by the region selector 2310, the node designator 2330 defines the nodes over the region of interest. In some embodiments, the costing engine 2340 assigns various constraints from the constraints database 2335 to the nodes based on the node types. The costing engine 2340 also defines the cost function for the region of interest. The optimization engine 2350 then performs the optimization of the cost function in order to identify a set of intensities that best print the design layout in a multi-exposure photolithographic printing process. The resulting set of optimized intensities are then processed by the polygon generator 2360 to define the photomasks used in decomposing the region of interest for the multi-exposure photolithographic printing process.

V. System Architecture Overview

Many of the above-described processes and engines are implemented as software processes that are specified as a set of instructions recorded on a machine readable medium (also referred to as computer readable medium). When these instructions are executed by one or more computational element(s) (such as processors or other computational elements like ASICs and FPGAs), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention.

Figure 26:
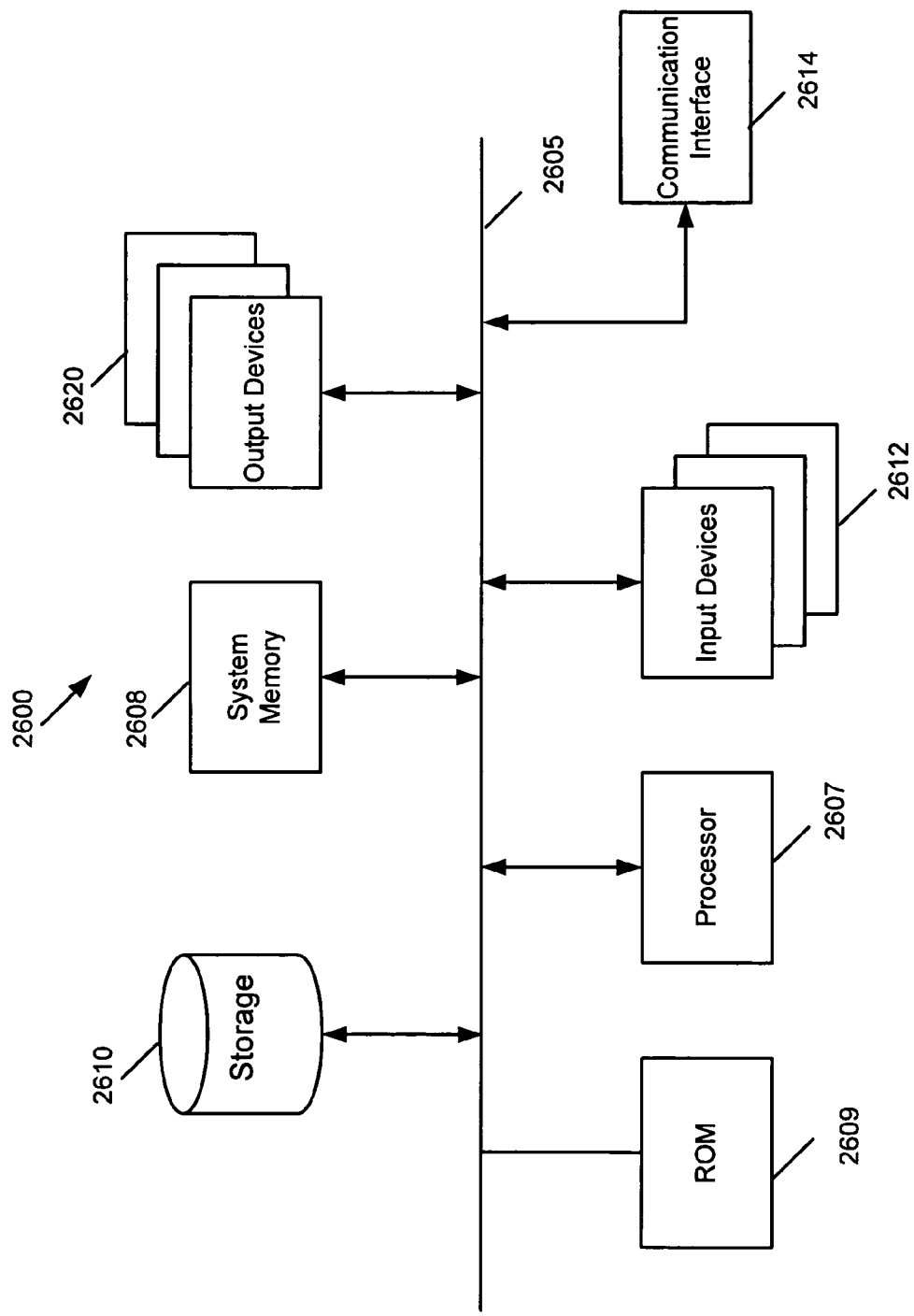
FIG. 26 is a block diagram of an illustrative computing system suitable for implementing an embodiment of the present invention.

FIG. 26 is a block diagram of an illustrative computing system 2600 suitable for implementing an embodiment of the present invention. Computer system 2600 includes a bus 2606 or other communication mechanism for communicating information, which interconnects subsystems and devices, such as processor 2607, system memory 2608 (e.g., RAM), static storage device 2609 (e.g., ROM), disk drive 2610 (e.g., magnetic or optical), communication interface 2614 (e.g., wireless 802.11b/g or Ethernet card), input device 2612 (e.g., keyboard or cursor control), and output device 2620 (e.g., display monitor).

According to one embodiment, computer system 2600 performs specific operations by processor 2607 executing one or more sequences of one or more instructions contained in system memory 2608. Such instructions may be read into system memory 2608 from another computer readable/usable medium, such as static storage device 2609 or disk drive 2610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium", "computer readable storage medium", or "computer usable medium" as used herein refers to any tangible medium that participates in providing instructions to processor 2607 for execution. Such a medium may take many forms, including but not limited to, non-volatile media and volatile media. Non-volatile media includes, for example, optical or magnetic disks, such as disk drive 2610. Volatile media includes dynamic memory, such as system memory 2608. Common forms of computer readable media includes, for example, floppy disk, flexible disk, hard disk, magnetic tape, any other magnetic medium, DVD-ROM, DVD-RAM, CD-ROM, any other optical medium, RAM, PROM, EPROM, FLASH-EPROM, any other memory chip or cartridge, or similar tangible medium from which a computer can read.

In an embodiment of the invention, execution of the sequences of instructions to practice the invention is performed by a single computer system 2600. According to other embodiments of the invention, two or more computer systems 2600 coupled by the communication interface 2614 (e.g., LAN, PTSN, or wireless network) may perform the sequence of instructions required to practice the invention in coordination with one another.

Computer system 2600 may transmit and receive messages, data, and instructions, including program, i.e., application code, through the communication interface 2614. Received program code may be executed by processor 2607 as it is received, and/or stored in disk drive 2610, or other non-volatile storage for later execution.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. A method for decomposing a particular pattern on a layer of a design layout into a set of images for generating multiple sub-patterns for multiple photolithographic operations, the method comprising:
   a) by a computer, imposing a grid on the particular pattern to define a set of nodes, each node associated with a cost;
   b) based on said cost, searching through a space of lithographically feasible images to identify a set of at least two images for decomposing the particular pattern;
   c) determining whether a union of the identified set of images adequately approximates the particular pattern; and
   d) repeating operations (b) and (c) until a particular set of images is identified that has a union that adequately approximates the particular pattern.

2. The method of claim 1 further comprising using the identified particular set of images to produce a set of photomasks to generate the multiple sub-patterns during the multiple photolithographic operations.

3. The method of claim 1, wherein determining whether the union of the identified set of images adequately approximates the particular pattern comprises optimizing a function.

4. The method of claim 3, wherein the function comprises values of image intensities at positions selected according to the particular pattern.

5. A method for decomposing a particular pattern on a layer of a design layout into a set of images for generating multiple sub-patterns for multiple photolithographic operations, the method comprising:
   a) by a computer, defining a mathematical model to bound a search through a solution space to only lithographically feasible images;
   b) searching through a space of lithographically feasible images to identify a set of at least two images for decomposing the particular pattern;
   c) determining whether a union of the identified set of images adequately approximates the particular pattern; and
   d) repeating operations (b) and (c) until a particular set of images is identified that has a union that adequately approximates the particular pattern.

6. The method of claim 5, wherein the mathematical model is an image-intensity model that bounds the search to only lithographically feasible images.

7. The method of claim 6, wherein the mathematical model includes at least two Fourier decomposition equations for two intensity images.

8. A method for decomposing a particular pattern on a layer of a design layout into multiple sub-patterns for multiple photolithographic exposure operations, the method comprising:
   a) by a computer, defining an objective function in terms of at least two different image intensities, each image intensity comprising values corresponding to a different photolithographic exposure operation, the image intensity values located at different spatial locations along a region of interest in the layer that includes the particular pattern;
   b) solving the objective function by identifying two sets values for the two image intensities, said two sets of values producing an optimal value for the objective function; and
   c) using the identified sets of image intensity values to produce said sub-patterns.

9. The method of claim 8, wherein defining the objective function comprises:
   a) identifying a plurality of locations in the pattern; and
   b) for each location, identifying a cost expression that is dependent on an image intensity value for at least one lithographic exposure operation.

10. The method of claim 8, wherein the particular pattern is in a region of the design-layout layer, wherein defining the objective function further comprises:
    a) identifying a plurality of locations that are in the region but outside of the pattern; and
    b) for each location in the region but outside of the pattern, identifying a cost expression that is dependent on an image intensity value for at least one lithographic exposure operation.

11. The method of claim 10, wherein identifying the plurality of locations comprises imposing a grid on the pattern, said grid having a plurality of nodes, said locations corresponding to the locations of the nodes imposed on the pattern.

12. The method of claim 8 further comprising generating a photomask for each exposure operation using said sub-patterns.

13. The method of claim 12, wherein using the identified sets of image intensity values to produce said sub-patterns comprises converting the image intensity values to a set of binary values used to produce the sub-patterns for the photomasks.

14. The method of claim 8, wherein an intensity value for the region that exceeds a specified threshold defines a spatial location to be printed during a particular exposure corresponding to the intensity value, and wherein an intensity value for the region that does not exceed a specified threshold defines a spatial location that is not to be printed during a particular exposure corresponding to the intensity value.

15. The method of claim 8, wherein a set of image intensity values represents a grayscale model for results that are feasibly achievable in a particular exposure operation according to printability constraints of the photolithographic exposure operations.

16. The method of claim 8, wherein using the identified sets of image intensity values to produce said sub-patterns comprises identifying sets of image intensity values for each exposure such that the union of the sets of image intensity values generates a pattern that is sufficient to approximately reproduce the particular pattern on the layout.

17. A system comprising:
   a) a first module for modeling a region of a layer of a design layout comprising at least one particular pattern in terms of at least two different image intensities, each image intensity comprising values corresponding to a different photolithographic exposure operation;
   b) a second module for identifying a plurality of locations on said particular layer, each location associated with a particular cost defined in terms of the at least two image intensity values; and
   c) a third module for iteratively searching through a space of lithographically feasible images based on said particular cost to identify a set of at least two images for decomposing the particular pattern when a union of the identified images adequately approximates the particular pattern.

18. The system of claim 17 further comprising a fourth module for using the identified particular images to produce a set of photomasks to generate multiple sub-patterns of the decomposed particular pattern during multiple photolithographic operations.

19. The system of claim 17, wherein a set of image intensity values represents a grayscale model for results that are feasibly achievable in a particular exposure operation according to printability constraints of the photolithographic exposure operation.

20. A non-transitory computer readable storage medium that stores a computer program for decomposing a particular pattern on a layer of a design layout into multiple sub-patterns for multiple photolithographic operations, the computer program executable by a processor, the computer program comprising sets of instructions for:
   a) imposing a grid on the particular pattern to define a set of nodes, each node associated with a particular cost;
   b) searching, based on said cost, through a space of lithographically feasible images to identify a set of at least two images for decomposing the particular pattern;
   c) determining whether a union of the identified set of images adequately approximates the particular pattern; and
   d) repeating the sets of instructions for operations (b) and (c) until a particular set of images is identified that has a union that adequately approximates the particular pattern.

21. The non-transitory computer readable storage medium of claim 20, wherein the computer program further comprises a set of instructions for using the identified particular set of images to produce a set of photomasks to generate the multiple sub-patterns during the multiple photolithographic operations.

22. The non-transitory computer readable storage medium of claim 20, wherein the set of instructions for determining whether the union of the identified set of images adequately approximates the particular pattern comprises a set of instructions for optimizing a function.

23. The non-transitory computer readable storage medium of claim 22, wherein the function comprises values of image intensities at positions selected according to the particular pattern.

24. A non-transitory computer readable storage medium that stores a computer program for decomposing a particular pattern on a layer of a design layout into multiple sub-patterns for multiple photolithographic operations, the computer program executable by a processor, the computer program comprising a set of instructions for:
   a) defining a mathematical model to bound a search through a solution space to only lithographically feasible images;
   b) searching through the solution space of lithographically feasible images to identify a set of at least two images for decomposing the particular pattern;
   c) determining whether a union of the identified set of images adequately approximates the particular pattern; and
   d) repeating operations (b) and (c) until a particular set of images is identified that has a union that adequately approximates the particular pattern.

25. The non-transitory computer readable storage medium of claim 24, wherein the particular mathematical model is an image-intensity model that bounds the search to only lithographically feasible images.

* * * * *